(12) United States Patent
Du et al.

(10) Patent No.: US 12,745,637 B2
(45) Date of Patent: Sep. 22, 2026

(54) POWER SEMICONDUCTOR MODULE AND MANUFACTURING METHOD THEREOF

(71) Applicant: Huawei Digital Power Technologies Co., Ltd., Shenzhen (CN)

(72) Inventors: Ruoyang Du, Dongguan (CN); Zhen Lv, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 524 days.

(21) Appl. No.: 18/451,912

(22) Filed: Aug. 18, 2023

(65) Prior Publication Data

US 2023/0395464 A1 Dec. 7, 2023

Related U.S. Application Data

(63) Continuation of application No. PCT/CN2021/079309, filed on Mar. 5, 2021.

(51) Int. Cl.

*H10W 40/47* (2026.01)
*H05K 7/20* (2006.01)
*H10W 40/25* (2026.01)
*H10W 90/00* (2026.01)

(52) U.S. Cl.

CPC ........ *H10W 40/47* (2026.01); *H05K 7/20927* (2013.01); *H10W 40/255* (2026.01); *H10W 90/00* (2026.01)

(58) Field of Classification Search

None

See application file for complete search history.

(56) References Cited

U.S. PATENT DOCUMENTS 8,421,235 B2 * 4/2013 Ide ........................ H10W 40/47 257/773
8,919,428 B2 * 12/2014 Cola ...................... B01J 23/745 165/185
9,941,234 B2 * 4/2018 Liang .................. H10W 40/228
(Continued)

FOREIGN PATENT DOCUMENTS

CN 205595329 U 9/2016
CN 206210776 U 5/2017
(Continued)

*Primary Examiner* — Nishath Yasmeen
(74) *Attorney, Agent, or Firm* — Maier & Maier, PLLC

(57) ABSTRACT

A power semiconductor module, a motor driver and a method for manufacturing a power semiconductor module. A thermal conductive layer is disposed between a heat sink and a power semiconductor package, where the thermal conductive layer is a thermal conductive material having metal bonding wires on a surface, or is a solid-state thermal conductive layer formed by curable silicone grease, so that both the power semiconductor package and the heat sink are combined with the thermal conductive layer to form the power semiconductor module, thereby reducing a risk of damage caused by stress generated by the power semiconductor module in a process of assembling the entire motor driver. This implements helium inspection of the power semiconductor module in advance, improves a qualification rate of secondary processing of the entire motor driver.

17 Claims, 13 Drawing Sheets

(56) References Cited

U.S. PATENT DOCUMENTS

| | | | | |
|---|---|---|---|---|
| 2004/0009353 | A1* | 1/2004 | Knowles | B32B 9/04 257/E23.101 |
| 2004/0265489 | A1* | 12/2004 | Dubin | H10W 40/25 257/E23.09 |
| 2005/0116336 | A1* | 6/2005 | Chopra | B82Y 10/00 257/E23.11 |
| 2011/0316143 | A1* | 12/2011 | Noritake | H10W 40/00 257/713 |
| 2013/0020694 | A1 | 1/2013 | Liang et al. | |
| 2016/0351468 | A1* | 12/2016 | Liang | H10W 40/228 |
| 2020/0212819 | A1* | 7/2020 | Hirata | H02M 1/0006 |

FOREIGN PATENT DOCUMENTS

| | | | |
|---|---|---|---|
| CN | 110797318 | A | 2/2020 |
| CN | 111261599 | A | 6/2020 |
| JP | 2007096536 | A | 4/2007 |
| JP | 2012065544 | A | 3/2012 |
| JP | 5092654 | B2 | 12/2012 |

* cited by examiner

POWER SEMICONDUCTOR MODULE AND MANUFACTURING METHOD THEREOF

CROSS-REFERENCE TO RELATED APPLICATIONS

This application is a continuation of International Application No. PCT/CN2021/079309, filed on Mar. 5, 2021, which is hereby incorporated by reference in its entirety.

TECHNICAL FIELD

The embodiments relate to the field of power semiconductor module technologies, a power semiconductor module and a manufacturing method thereof, a motor driver, a powertrain, and a vehicle.

BACKGROUND

A power semiconductor module is a semiconductor device that implements a circuit switching function and may be packaged by power semiconductor chips bridged by using a circuit. The power semiconductor chip may include an insulated gate bipolar transistor (IGBT), a diode, a metal-oxide-semiconductor field-effect transistor (MOSFET), a thyristor, a triode, and the like. The power semiconductor module is a core component of a motor driver (MCU) and a most important heat emitting component. A heat dissipation capability of a package of the power semiconductor module plays a decisive role in a performance parameter index of a product.

Currently, the package of the power semiconductor module is divided into two structures: single side cooling and double side cooling. A difference between the two structures may be whether heat is unidirectionally transferred from a single surface of the device to a cooling medium or bidirectionally transferred from two surfaces of the device to the cooling medium. Under a same process condition, the double side cooling package has a stronger heat dissipation capability, which helps bring performance of the power semiconductor chip into full play, improve product power density, and reduce product costs. For the power semiconductor module with the double side cooling package, the power semiconductor package may be placed between two heat sinks, and a thermal conductive interface material (thermal conductive silicone grease, a graphite film, silica gel, a phase change material, and the like are commonly used in the industry) is disposed between the power semiconductor package and the heat sinks, and the two heat sinks are pressed and connected by using a mechanical structure (such as screws and bolts), to clamp the power semiconductor package and the thermal conductive interface material.

However, it is difficult to ensure uniform stress on all parts of the power semiconductor module by using the mechanical structure to press the heat sinks, so that the power semiconductor module may be damaged due to stress generated by the power semiconductor module in a process of assembling the entire motor driver, and the entire motor driver is scrapped. In addition, thermal conductive silicone grease is easy to dry and fall off after being used for a period of time, and the heat dissipation capability of the power semiconductor module is reduced.

SUMMARY

The embodiments may provide a power semiconductor module and a manufacturing method thereof, a motor driver, a powertrain, and a vehicle. A solid-state thermal conductive layer that has a fastening function and is not easy to fall off is formed between a heat sink and a power semiconductor package, so that all parts of the power semiconductor module are subject to uniform stress, and a risk of damage caused by stress generated by the power semiconductor module in a process of assembling the entire motor driver is reduced. In addition, integrated processing of the power semiconductor package and the heat sink and helium inspection of the power semiconductor module can be implemented before the entire motor driver is assembled, thereby avoiding a risk of scrapping the entire motor driver due to water leakage of the heat sink during a test of the entire motor driver.

According to a first aspect, an embodiment may provide a power semiconductor module, including at least one heat sink and at least one power semiconductor package, and further including a thermal conductive layer. The thermal conductive layer is located between the heat sink and the power semiconductor package, and the thermal conductive layer is a thermal conductive material having metal bonding wires on a surface or a solid-state thermal conductive layer formed by curable silicone grease; and both the power semiconductor package and the heat sink are combined with the thermal conductive layer to form the power semiconductor module.

The thermal conductive layer is configured as the thermal conductive material having metal bonding wires on a surface, or the thermal conductive layer is the solid-state thermal conductive layer formed by curable silicone grease, so that bonding (bond) connections are implemented between the metal bonding wires of the thermal conductive layer and the heat sink and between the metal bonding wires of the thermal conductive layer and the power semiconductor package through heating and pressing, and binding force having molecular bonding force is formed between the heat sink and the thermal conductive layer and between the power semiconductor package and the thermal conductive layer. Alternatively, the thermal conductive layer is the solid-state thermal conductive layer formed by curable silicone grease, and when the curable silicone grease is cured between the heat sink and the power semiconductor package, a cured thermal conductive layer mutually embedded with the heat sink and the power semiconductor package is formed. In this way, the thermal conductive layer between the power semiconductor package and the heat sink has a fastening function and is not easy to fall off, so that stress between the heat sink and the power semiconductor package is uniform, and a risk of damage caused by stress generated by the power semiconductor module in a process of assembling an entire motor driver is reduced. In addition, integrated processing of the power semiconductor package and the heat sink and helium inspection of the power semiconductor module can be implemented, so that a defective product, that is, a heat sink with air leakage, can be screened out in advance, and a qualified power semiconductor module can be directly applied to the assembly of the entire motor driver. This improves an automation level and a processing speed of the assembly of the entire motor driver, improves a yield of secondary processing of the entire motor driver, and avoids a risk of scrapping the entire motor driver due to water leakage of the heat sink during a helium test of the entire motor driver.

In a possible implementation of the first aspect, the binding force having molecular bonding force or embedding force is formed between the thermal conductive layer and the heat sink, and between the thermal conductive layer and the power semiconductor package.

The molecular bonding force or the embedding force is strong mutual binding force, and the molecular bonding force or the embedding force formed between the thermal conductive layer and the heat sink and between the thermal conductive layer and the power semiconductor package can firmly fasten the heat sink to the power semiconductor package. In a possible implementation of the first aspect, the thermal conductive layer includes a metal thermal conductive sheet and the metal bonding wires disposed on a surface of the metal thermal conductive sheet.

In a possible implementation of the first aspect, the metal thermal conductive sheet is a copper foil, an aluminum foil, a silver foil, or a gold leaf, and the metal bonding wire is a nano copper wire, a nano aluminum wire, a nano silver wire, or a nano gold wire.

The metal bonding wires and a copper layer or an aluminum layer on surfaces of the heat sink and the power semiconductor package are heated and pressed, to form molecular bonding force for intermetallic fusion, which can firmly fasten the heat sink to the power semiconductor package. In addition, the nano copper wire, the nano aluminum wire, the nano silver wire, the nano gold wire, the copper foil, the aluminum foil, the silver foil or the gold leaf all have good heat conductivity and can greatly improve a heat dissipation capability of the power semiconductor module.

In a possible implementation of the first aspect, the thermal conductive layer further includes thermal conductive adhesive, and the thermal conductive adhesive is distributed in a gap between adjacent metal bonding wires.

The thermal conductive adhesive is disposed to closely adhere the thermal conductive layer to the heat sink and the power semiconductor package. In this way, when the heat sink, the power semiconductor package, and the thermal conductive layer are fastened under conditions of heating and pressing, under the action of the thermal conductive adhesive, good fastening effect can be achieved between the heat sink and the thermal conductive layer and between the power semiconductor package and the thermal conductive layer under process conditions of a lower temperature and lower pressure. Therefore, the thermal conductive adhesive is disposed, so that the temperature and pressure for performing heating and pressing processing on the heat sink, the power semiconductor package, and the thermal conductive layer are reduced, which helps improve a production yield of the process.

In a possible implementation of the first aspect, there are two heat sinks, the two heat sinks are respectively a first heat sink and a second heat sink that are opposite to each other, the power semiconductor package is disposed between the first heat sink and the second heat sink, and the thermal conductive layer is disposed between the power semiconductor package and the first heat sink and between the power semiconductor package and the second heat sink.

The power semiconductor package is disposed between the first heat sink and the second heat sink to form the power semiconductor module with a double side cooling structure, and heat can be bidirectionally transferred from two surfaces of the power semiconductor package to the first heat sink and the second heat sink. Compared with a single side cooling structure, the double side cooling structure has a stronger heat dissipation capability under a same process condition, which helps bring performance of a power semiconductor chip into full play, improve product power density, and reduce product costs.

In a possible implementation of the first aspect, one end of the first heat sink and one end of the second heat sink are connected by using a connecting plate, and the other end of the first heat sink and the other end of the second heat sink are connected by using a fastener.

A heat dissipation structure formed by connecting one end of the first heat sink and one end of the second heat sink by using the connecting plate, and by connecting the other end of the first heat sink and the other end of the second heat sink by using the fastener is applicable to a heat dissipation manner in which heat dissipation water channels are connected in series.

Alternatively, two ends of the first heat sink and the second heat sink are connected by using a connecting pipe, and two ends of the first heat sink and the second heat sink are connected by using a connecting pipe.

A heat dissipation structure formed by separately connecting one end of the first heat sink and one end of the second heat sink and the other end of the first heat sink and the other end of the second heat sink by using the connecting pipes is applicable to a heat dissipation manner in which the heat dissipation water channels are connected in parallel.

In a possible implementation of the first aspect, a heat dissipation water channel is disposed inside the first heat sink and a heat dissipation water channel is disposed inside the second heat sink, the heat dissipation water channel in the first heat sink and the heat dissipation water channel in the second heat sink are connected in series by using the connecting plate, and a water inlet and a water outlet that communicate with the heat dissipation water channels are respectively disposed at the other end of the first heat sink and the other end of the second heat sink.

The heat dissipation water channel inside the first heat sink communicates with the heat dissipation water channel inside the second heat sink through a heat dissipation water channel inside the connecting plate, to form a heat dissipation structure in which the heat dissipation water channels are connected in series. The water inlet and the water outlet are located on a same side of the heat sinks, and a coolant enters the heat dissipation water channel inside the first heat sink from the water inlet to absorb heat of the first heat sink. Then, the coolant flows into the heat dissipation water channel of the second heat sink through the heat dissipation water channel in the connecting plate to absorb heat of the second heat sink, and finally flows out of the water outlet to take away all the heat.

Alternatively, a heat dissipation water channel is disposed inside the first heat sink and a heat dissipation water channel is disposed inside the second heat sink, the heat dissipation water channel in the first heat sink and the heat dissipation water channel in the second heat sink are connected in parallel by using the connecting pipes, and a water inlet is disposed at one end of the first heat sink, and a water outlet is disposed at one end that is of the second heat sink and that is away from the water inlet.

The heat dissipation water channel inside the first heat sink communicates with the heat dissipation water channel inside the second heat sink by using the connecting pipes located between the first heat sink and the second heat sink, and the connecting pipes are located at two ends of the two heat sinks, to form a heat dissipation structure in which the heat dissipation water channels are connected in parallel. The water inlet and the water outlet are respectively located at two sides of the heat sinks, the coolant enters the heat dissipation water channel inside the first heat sink from the water inlet, a part of the coolant flows along the heat dissipation water channel to absorb the heat of the first heat sink and enters the water outlet by using the connecting pipe adjacent to the water outlet side to take away the heat. The other part of the coolant enters the heat dissipation water channel inside the second heat sink by using the connecting pipe adjacent to the water inlet side, flows along the heat dissipation water channel to absorb the heat of the second heat sink, and then enters the water outlet to take away the heat.

In a possible implementation of the first aspect, each power semiconductor package at least includes a first substrate, a second substrate, and at least one chip, and the chip is fastened between the first substrate and the second substrate; and the at least one chip is electrically connected to the first substrate and the second substrate. In this way, a circuit is formed between the chip and the first substrate, and between the chip and the second substrate.

The thermal conductive layer is disposed between the heat sink and the first substrate and/or between the heat sink and the second substrate and is configured to transfer heat generated by the power semiconductor package to the heat sink.

In a possible implementation of the first aspect, the chip includes an IGBT chip and a diode chip.

Alternatively, the chip includes a silicon (Si) metal-oxide-semiconductor field-effect transistor (MOSFET) or a silicon carbide (SiC) metal-oxide-semiconductor field-effect transistor (MOSFET).

In a possible implementation of the first aspect, the power semiconductor package further includes at least one conductive pad, and the conductive pad conducts electricity and supports the first substrate and the second substrate.

The conductive pad is located between the chip and the first substrate; and two ends of the conductive pad are respectively connected to the chip and the first substrate by using conductive connecting layers.

In a possible implementation of the first aspect, the first substrate has a first conductive area and a second conductive area that are insulated from each other and arranged side by side.

The second substrate has a third conductive area and a fourth conductive area that are insulated from each other and arranged side by side, the first conductive area is opposite to the third conductive area, and the second conductive area is opposite to the fourth conductive area.

A part of the chip is located between the first conductive area and the third conductive area, and a part of the chip is located between the second conductive area and the fourth conductive area.

In addition, the first conductive area is connected to the fourth conductive area, or the second conductive area is connected to the third conductive area.

In this way, the first conductive area and the third conductive area are connected by using the chip, the second conductive area and the fourth conductive area are connected by using the chip, and the first conductive area and the fourth conductive area are connected, so that the third conductive area, the first conductive area, the fourth conductive area, and the second conductive area are connected.

Alternatively, the second conductive area is connected to the third conductive area, so that the first conductive area, the third conductive area, the second conductive area, and the fourth conductive area form a circuit.

In a possible implementation of the first aspect, both the first substrate and the second substrate are conductive plates.

In addition, the first substrate includes a first conductive plate and a second conductive plate that are insulated from each other and arranged side by side, the first conductive plate has the first conductive area, and the second conductive plate has the second conductive area.

The second substrate includes a third conductive plate and a fourth conductive plate that are insulated from each other and arranged side by side, the third conductive plate has the third conductive area, and the fourth conductive plate has the fourth conductive area.

In addition, the heat sink is disposed to be insulated from the conductive plate, to avoid a connection between the conductive plate and the heat sink.

In a possible implementation of the first aspect, the first substrate includes a first conductive layer and a first insulation plate, and the first conductive layer is located on a surface that is of the first insulation plate and that faces the chip.

The second substrate includes a second conductive layer and a second insulation plate, and the second conductive layer is located on a surface that is of the second insulation plate and that faces the chip.

In addition, the first conductive layer at least includes the first conductive area and the second conductive area, and the second conductive layer at least includes the third conductive area and the fourth conductive area.

The first insulation plate and the second insulation plate are respectively configured to prevent the first conductive layer and the second conductive layer from being connected to the heat sink.

In a possible implementation of the first aspect, the first substrate further includes a first copper layer, and the first copper layer plays a role in protection and heat conduction. The first copper layer is located on a surface that is of the first insulation plate and that faces the thermal conductive layer, and the first copper layer is configured to protect the first insulation plate, prevents the first insulation plate from breaking, and has a heat conduction function.

The second substrate further includes a second copper layer, and the second copper layer plays a role in protection and heat conduction. The second copper layer is located on a surface that is of the second insulation plate and that faces the thermal conductive layer, and the second copper layer is configured to protect the second insulation plate, prevents the second insulation plate from breaking, and has a heat conduction function.

The thermal conductive layer is disposed between the heat sink and the first copper layer and/or between the heat sink and the second copper layer.

In a possible implementation of the first aspect, the power semiconductor package further includes a wiring terminal, one end of the wiring terminal has a first terminal and a second terminal, one of the first terminal and the second terminal is electrically connected to the first conductive area, and the other of the first terminal and the second terminal is electrically connected to the fourth conductive area, so that the first conductive area is connected to the fourth conductive area.

Alternatively, one of the first terminal and the second terminal is electrically connected to the second conductive area, and the other of the first terminal and the second terminal is electrically connected to the third conductive area, so that the second conductive area is connected to the third conductive area.

Alternatively, both the first terminal and the second terminal are electrically connected to the third conductive area or both the first terminal and the second terminal are electrically connected to the fourth conductive area.

In a possible implementation of the first aspect, the power semiconductor package further includes a first electrode terminal and a second electrode terminal, one of the first electrode terminal and the second electrode terminal is a positive terminal, and the other of the first electrode terminal and the second electrode terminal is a negative terminal.

One of the first electrode terminal and the second electrode terminal is electrically connected to the first conductive area, and the other of the first electrode terminal and the second electrode terminal is electrically connected to the fourth conductive area.

Alternatively, one of the first electrode terminal and the second electrode terminal is electrically connected to the second conductive area, and the other of the first electrode terminal and the second electrode terminal is electrically connected to the third conductive area.

In a possible implementation of the first aspect, the power semiconductor package further includes a first conductive column and a second conductive column, and the first conductive column and the second conductive column are separately located between the first substrate and the second substrate.

The second substrate further has a fifth conductive area, and the fifth conductive area is disposed to be insulated from both the third conductive area and the fourth conductive area.

Both the first terminal and the second terminal of the wiring terminal are electrically connected to the fourth conductive area, two ends of the first conductive column are electrically connected to the first conductive area and the fourth conductive area respectively, and two ends of the second conductive column are electrically connected to the second conductive area and the fifth conductive area respectively.

One of the first electrode terminal and the second electrode terminal is electrically connected to the third conductive area, and the other of the first electrode terminal and the second electrode terminal is electrically connected to the fifth conductive area.

The third conductive area, the first conductive area, the fourth conductive area, the second conductive area, and the fifth conductive area form a circuit by using the first conductive column and the second conductive column and form a conductive loop with the first electrode terminal and the second electrode terminal.

In a possible implementation of the first aspect, the power semiconductor package further includes a packaging layer, and the first substrate, the second substrate, and the at least one chip are located in the packaging layer. Components such as the first substrate, the second substrate, and the chip are fastened and sealed by using the packaging layer, so that the components form the power semiconductor package. At least a part of an area that is of the packaging layer and that is opposite to at least one of the first substrate and the second substrate is an exposed area, and a surface that is of the at least one of the first substrate and the second substrate and that faces the thermal conductive layer is exposed in the exposed area. In this way, blocking of the packaging layer is eliminated, and contact between the substrate and the thermal conductive layer is closer, which is beneficial to heat transfer.

In a possible implementation of the first aspect, the power semiconductor package further includes a signal terminal, one end of the signal terminal is located in the packaging layer and is electrically connected to the chip, and the other end of the signal terminal is located outside the packaging layer.

In a possible implementation of the first aspect, the power semiconductor package further includes a bonding wire, one end of the bonding wire is in a bonding connection to the chip, and the other end of the bonding wire is in a boding connection to the signal terminal, so that the chip is connected to the signal terminal.

Alternatively, a soldering pad is disposed at one end of the second substrate, the other end of the bonding wire is in a bonding connection to the soldering pad, and one end of the signal terminal is electrically connected to the soldering pad, so that the chip is electrically connected to the signal terminal.

Alternatively, a soldering pad is disposed at one end of the second substrate, the chip is electrically connected to the soldering pad, and one end of the signal terminal is electrically connected to the soldering pad, so that the chip is electrically connected to the signal terminal.

According to a second aspect, an embodiment may provide a motor driver, including a capacitor and at least one power semiconductor module described above, and an electrode terminal of the power semiconductor module is electrically connected to the capacitor.

According to a third aspect, an embodiment may provide a powertrain, including a motor and the motor driver connected to the motor.

According to a fourth aspect, an embodiment may provide a vehicle, including wheels, a motor, and the motor driver connected to the motor, and the motor is connected to the wheels by using a transmission component.

According to a fifth aspect, an embodiment may provide a method for manufacturing a power semiconductor module, and the method includes the following steps:

providing at least one power semiconductor package and a heat sink;

separately disposing an interface material on a top surface and/or a bottom surface of the power semiconductor package, where the interface material is a thermal conductive material having metal bonding wires on a surface, or the interface material is curable silicone grease; and press-fitting, for preset time at a preset temperature and preset pressure, the power semiconductor package on which the interface material is disposed with the heat sink, to form the power semiconductor module.

In a possible implementation of the fifth aspect, when the interface material is the curable silicone grease, the press-fitting, for preset time at a preset temperature and preset pressure, the power semiconductor package on which the interface material is disposed with the heat sink, to form the power semiconductor module includes the following steps:

performing, for first preset time and under first preset pressure and first preset temperature conditions, press-fitting preprocessing on the power semiconductor package on which the interface material is disposed and the heat sink; and performing, for second preset time and under second preset pressure and second preset temperature conditions, curing processing between the preprocessed power semiconductor package and the heat sink, so that the curable silicone grease forms a solid-state thermal conductive layer.

The curable silicone grease is an adhesive liquid material, and an adhesive and stable solid-state thermal conductive layer can be formed after the preprocessing and the curing processing, to firmly fasten the heat sink to the power semiconductor package and form the power semiconductor module. The cured silicone grease does not liquefy after the temperature is lowered.

In a possible implementation of the fifth aspect, when the interface material is the thermal conductive material having metal bonding wires on a surface, before the separately disposing an interface material on a top surface and/or a bottom surface of the power semiconductor package, the method further includes the following steps:

performing deoxidation treatment on the top surface and/or the bottom surface of the power semiconductor package; and forming a metal plating layer on a surface that is of the heat sink and that faces the power semiconductor package, or performing the deoxidation treatment on a surface that is of the heat sink and that faces the power semiconductor package.

The deoxidation treatment makes the top surface and the bottom surface of the power semiconductor package expose a metal element, and the metal plating layer formed on the surface that is of the heat sink and that faces the power semiconductor package can prevent generation of an oxidized layer, so that the metal bonding wires and metal materials on surfaces of the heat sink and the power semiconductor package are respectively bonded through heating and pressing, and binding force having molecular bonding force is separately formed between the interface material and the surface of the heat sink and between the interface material and the surface of the power semiconductor package.

If the metal plating layer is not applied to the surface that is of the heat sink and that faces the power semiconductor package, the deoxidation treatment may also be performed on the surface to expose the metal element. This can also ensure that the metal material can form, between the heat sink and the power semiconductor package, the solid-state thermal conductive layer having the molecular bonding force or embedding force.

DETAILED DESCRIPTION THE OF EMBODIMENTS

Figure 1:
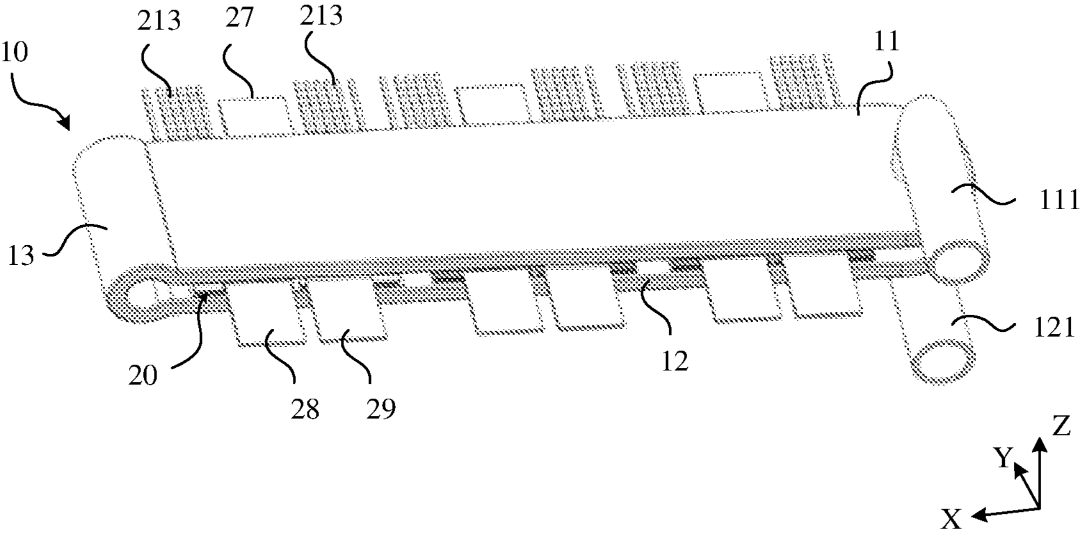
FIG. 1 is a schematic diagram of a power semiconductor module according to an embodiment.

Terms used in the implementations are merely used to explain the embodiments but are not intended as limiting.

In the conventional technology, for a power semiconductor module with a double side cooling package, the power semiconductor package may be placed between two heat sinks, and the two heat sinks are pressed and connected by using a mechanical structure. However, a disadvantage of pressing the heat sinks by using the mechanical structure lies in that it is not easy to ensure that all positions of the power semiconductor module are subject to uniform stress. For example, when the heat sinks are fastened, by using a plurality of bolts distributed between the upper and lower heat sinks, to the power semiconductor module assembled by the power semiconductor package, fastening force at a position close to the bolt may be greater than fastening force at a position far away from the bolt, and fastening force applied by bolts located in different positions cannot be ensured to be equal. In addition, it is difficult to ensure that fastening surfaces of the heat sinks and the power semiconductor package are completely flat, and coating thicknesses of a thermal conductive interface material may also be different. Therefore, stress is easily generated in a process of fastening the heat sinks and the power semiconductor package, and the power semiconductor module is easily damaged in a process of assembling an entire motor driver. In addition, to avoid a loss and a failure of the thermal conductive interface material, the power semiconductor module may be assembled on site while the entire motor driver is assembled, so that assembly difficulty is great and processing efficiency is low, and the power semiconductor module cannot be inspected in advance. It is difficult to determine whether the power semiconductor module is damaged during assembly. If a water leakage occurs in the heat sink of the power semiconductor module due to damage during a test of the entire motor driver, there is a risk that the entire motor driver is scrapped.

Based on this, embodiments may provide a power semiconductor module, a motor driver, a powertrain, and a method for manufacturing a power semiconductor module. A thermal conductive material having metal bonding wires on a surface or curable silicone grease is used in the power semiconductor module, and a solid-state thermal conductive layer that has a fastening function and is not easy to fall off is formed between a heat sink and a power semiconductor package. The power semiconductor package and the heat sink are fastened by using the solid-state thermal conductive layer, so that all parts of the power semiconductor module are subject to uniform stress, and a risk of damage caused by stress generated by the power semiconductor module in a process of assembling the entire motor driver is reduced. In addition, integrated processing of the power semiconductor package and the heat sink and helium inspection of the power semiconductor module can be implemented before the entire motor driver is assembled, and a qualified power semiconductor module is directly applied to the assembly of the entire motor driver. This avoids on-site assembly work of the power semiconductor module during the assembly of the entire motor driver, reduces a risk of scrapping the entire motor driver due to water leakage of the heat sink during a test of the entire motor driver and difficulty in assembling the entire motor driver, and improves an automation level and a processing speed of the assembly of the entire motor driver. The following describes a structure of the power semiconductor module by using different embodiments as examples.

Embodiment 1

As shown in FIG. 1, an embodiment may provide a power semiconductor module. The power semiconductor module may include at least one heat sink 10. For example, FIG. 1 includes two heat sinks: a first heat sink 11 and a second heat sink 12. As shown in FIG. 1, the power semiconductor module further includes at least one power semiconductor package 20. For example, in FIG. 1, there are three power semiconductor packages 20, and the three power semiconductor packages 20 are spaced apart between the first heat sink 11 and the second heat sink 12 in an X direction in FIG. 1. Terminals of each power semiconductor package 20 extend outward from between the first heat sink 11 and the second heat sink 12 in a Y direction and a —Y direction in FIG. 1. In some examples, a quantity of power semiconductor packages 20 may include, but is not limited to, three, and may also be two or more than three.

Figure 2:
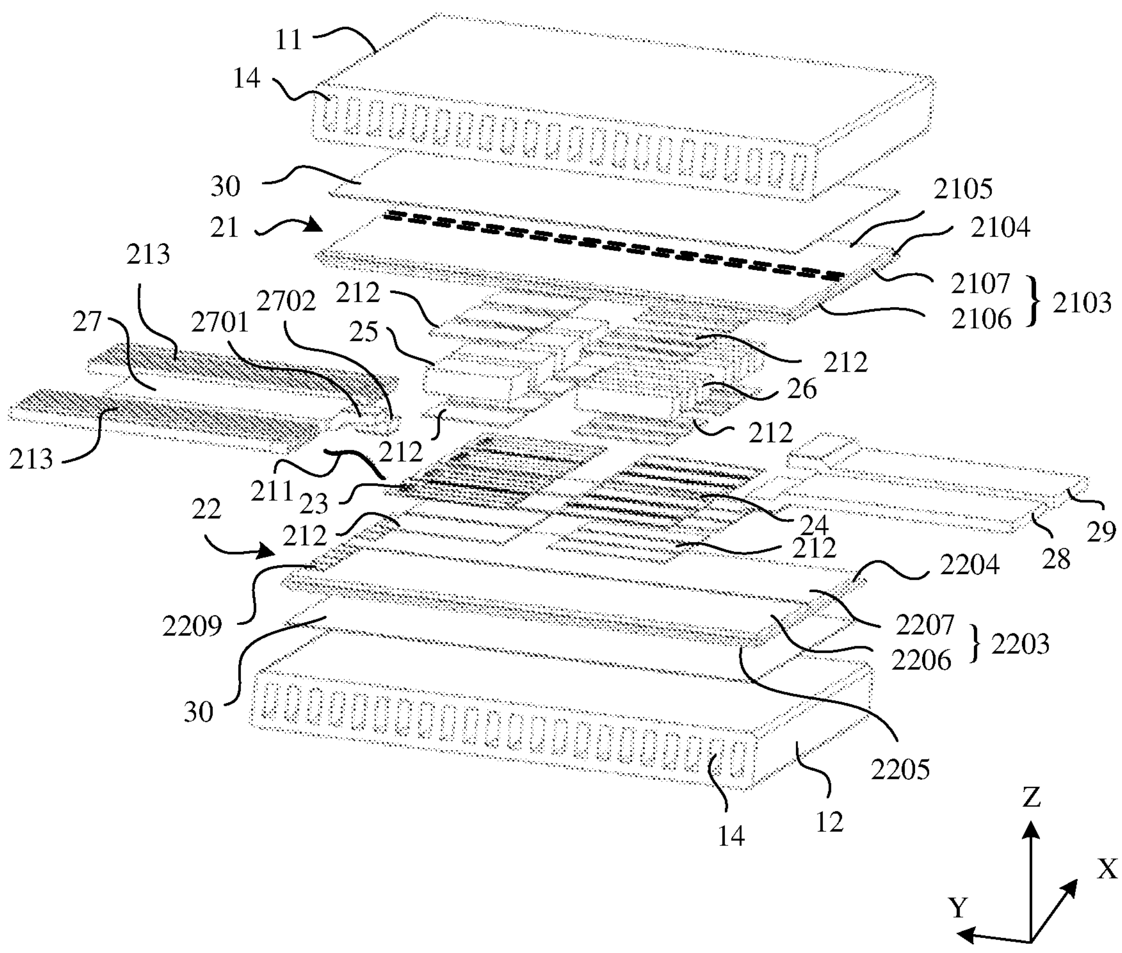
FIG. 2 is a schematic diagram of an exploded partial sectional view of a power semiconductor module according to an embodiment.
Figures 3A, 3B:
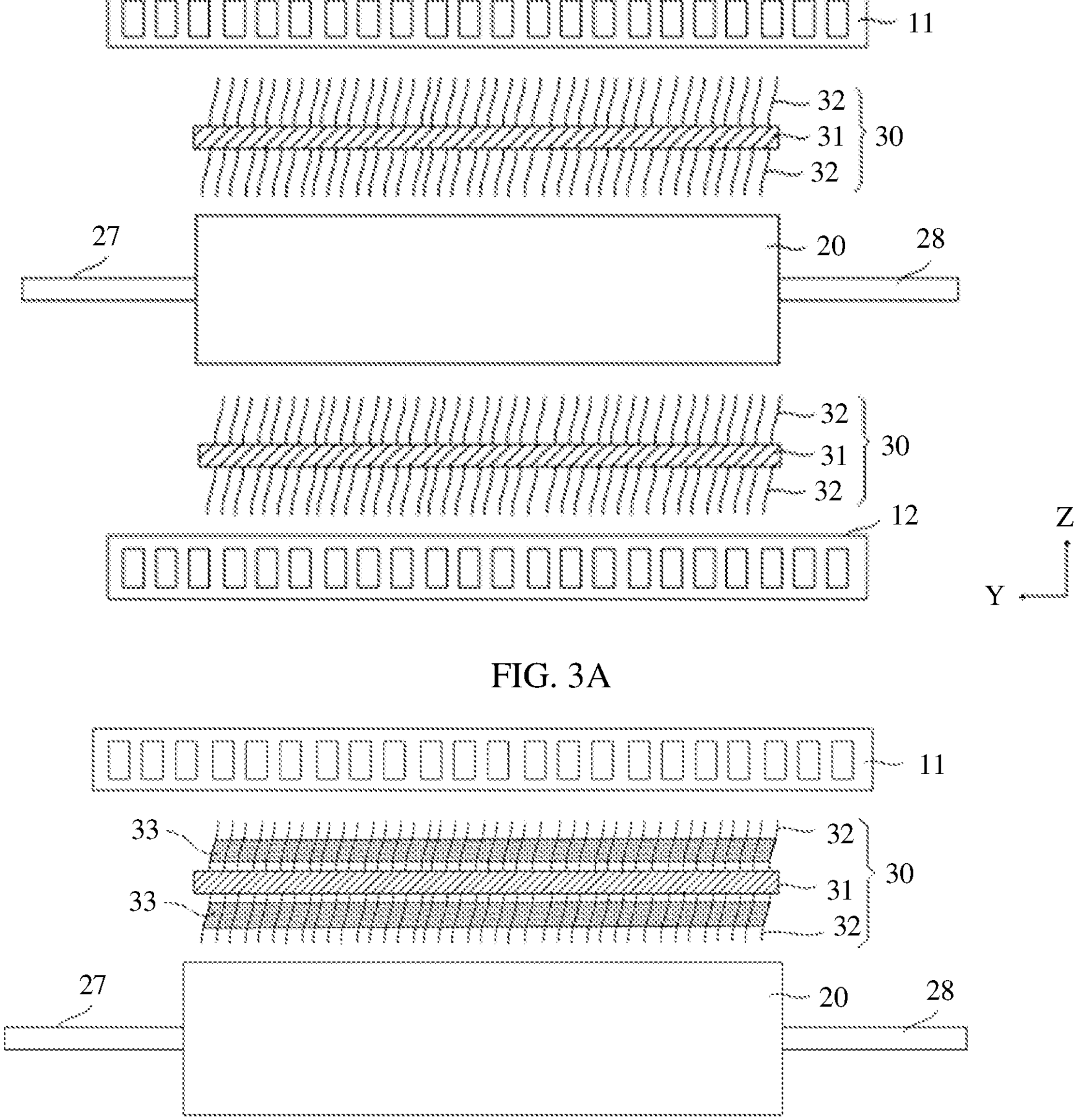
FIG. 3A is a schematic diagram of a sectional structure of a thermal conductive layer, a power semiconductor package, a first heat sink, and a second heat sink in a power semiconductor module according to an embodiment.
FIG. 3B is a schematic diagram of a sectional structure of a thermal conductive layer, a power semiconductor package, a first heat sink, and a second heat sink in a power semiconductor module according to an embodiment.
Figure 3C:
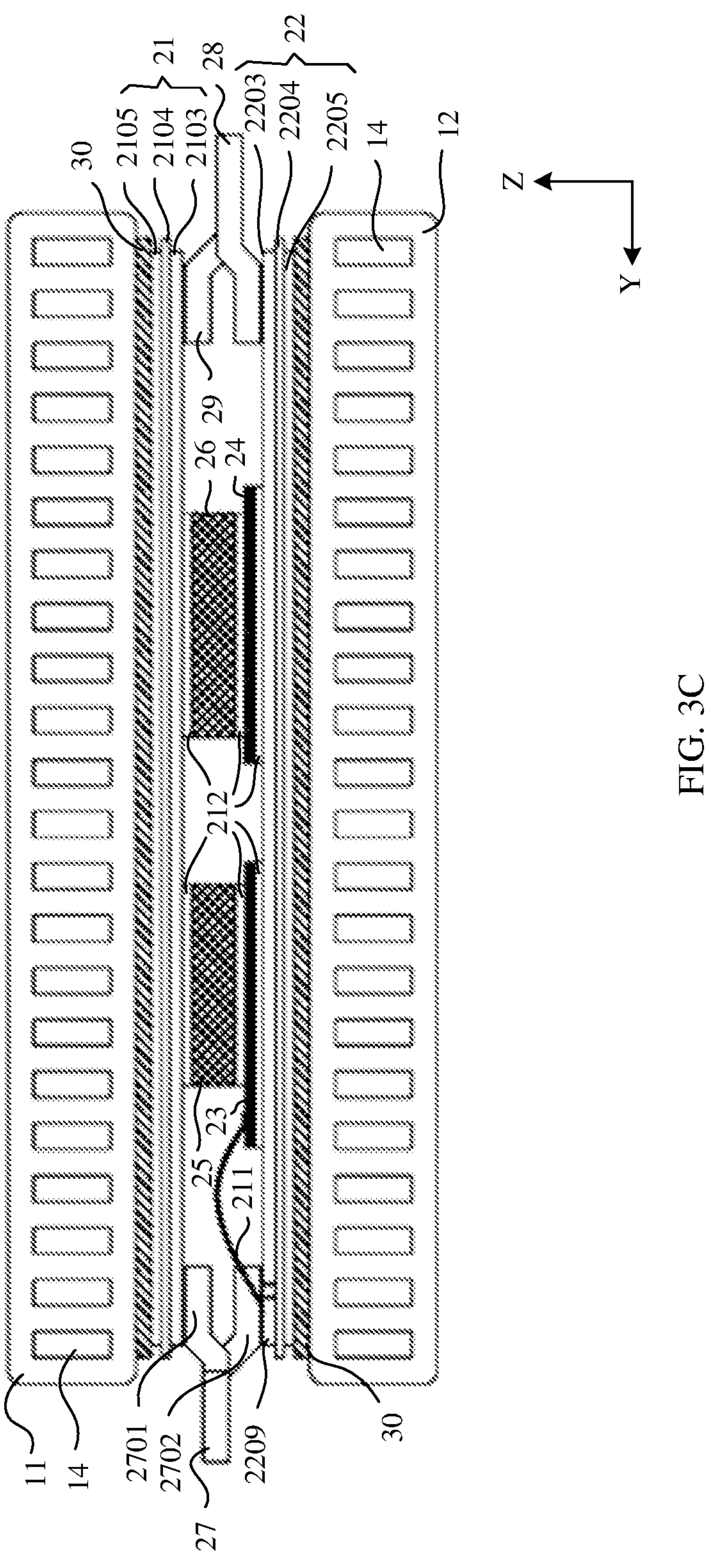
FIG. 3C is a schematic diagram of a sectional view of a power semiconductor module obtained after the power semiconductor module in FIG. 2 is assembled.

As shown in FIG. 1 and FIG. 2, the power semiconductor module further includes a thermal conductive layer 30 (refer to FIG. 2) located between the heat sink 10 and the power semiconductor package 20. For example, in the power semiconductor module shown in FIG. 1, as shown in FIG. 3C, in a Z direction are the second heat sink 12, the thermal conductive layer 30, the power semiconductor package 20, the thermal conductive layer 30, and the first heat sink 11 (as shown in FIG. 3C).

It should be noted that FIG. 2 is an exploded partial view of the power semiconductor module shown in FIG. 1 sectioned in the Y direction in FIG. 1.

In this embodiment, the thermal conductive layer 30 is a thermal conductive material having metal bonding wires 32 (refer to FIG. 3B) on a surface, or the thermal conductive layer 30 is a solid-state thermal conductive layer formed by curable silicone grease. Binding force having molecular bonding force or embedding force is separately formed between the power semiconductor package 20 and the thermal conductive layer 30 and between the heat sink 10 and the thermal conductive layer 30, so that the power semiconductor package 20 and the heat sink 10 form the power semiconductor module.

The thermal conductive layer 30 is configured as the thermal conductive material having metal bonding wires 33 on a surface, or the thermal conductive layer is the solid-state thermal conductive layer formed by curable silicone grease, so that bonding (bond) connections are implemented between the metal bonding wires 32 of the thermal conductive layer 30 and the heat sink 10 and between the metal bonding wires 32 of the thermal conductive layer 30 and the power semiconductor package 20 through heating and pressing, and the binding force having molecular bonding force is formed between the heat sink and the thermal conductive layer and between the power semiconductor package and the thermal conductive layer. Alternatively, the thermal conductive layer is the solid-state thermal conductive layer formed by curable silicone grease, and when the curable silicone grease is cured between the heat sink and the power semiconductor package, a cured thermal conductive layer mutually embedded with the heat sink and the power semiconductor package is formed. In this way, the thermal conductive layer between the power semiconductor package and the heat sink has a fastening function and is not easy to fall off, so that stress between the heat sink 10 and the power semiconductor package 20 is uniform, and a risk of damage caused by stress generated by the power semiconductor module in a process of assembling an entire motor driver is reduced. In addition, integrated processing of the power semiconductor package 20 and the heat sink 10 and helium inspection of the power semiconductor module can be implemented, so that a qualified power semiconductor module can be directly applied to the assembly of the entire motor driver. This avoids on-site assembly work of the power semiconductor module during the assembly of the entire motor driver, improves an automation level and a processing speed of the assembly of the entire motor driver, and reduces a risk of scrapping the entire motor driver due to water leakage of the heat sink during a test of the entire motor driver.

In this embodiment, the thermal conductive layer 30 may be described by using an example in which the thermal conductive layer 30 is the thermal conductive material having metal bonding wires 32 (refer to FIG. 3A) on a surface. For example, as shown in FIG. 3A, the thermal conductive layer 30 includes a metal thermal conductive sheet 31 and the metal bonding wires 32 disposed on surfaces of the metal thermal conductive sheet 31. As shown in FIG. 3B, the metal bonding wires 32 are disposed on both the upper and lower surfaces of the metal thermal conductive sheet 31. The metal bonding wires 32 are arranged vertically on the metal thermal conductive sheet 31, and there may be a gap between adjacent metal bonding wires 32.

When the thermal conductive layer 30 is located between the heat sink 10 and the power semiconductor package 20, to implement the fastening function of the thermal conductive layer to the heat sink 10 and the power semiconductor package 20 separately, the heat sink 10 and the power semiconductor package 20 need to be processed under conditions of heating and pressing. Under the conditions of heating and pressing, the metal bonding wires 32 are pressed and are in bonding connections to a copper layer or an aluminum layer on surfaces of the heat sink 10 and the power semiconductor package 20, so that metal in the metal bonding wires 32 diffuses into the copper layer or the aluminum layer on the surfaces of the heat sink 10 and the power semiconductor package 20. In this way, the binding force having molecular bonding force is formed between the thermal conductive layer 30 and the heat sink 10 and between the thermal conductive layer 30 and the power semiconductor package 20, and the heat sink 10 and the power semiconductor package 20 are firmly connected under the action of the thermal conductive layer 30.

In this embodiment, the metal thermal conductive sheet 31 may be a copper foil, an aluminum foil, a silver foil, or a gold leaf. The metal thermal conductive sheet 31 may alternatively be another metal foil. The metal bonding wire 32 is a nano copper wire, a nano aluminum wire, a nano silver wire, or a nano gold wire. The metal bonding wires 32 may alternatively be another nano metal wire. In this embodiment, an example in which the metal thermal conductive sheet 31 is the copper foil and the metal bonding wire 32 is the nano copper wire is used for description.

When the metal thermal conductive sheet 31 is the copper foil, and the metal bonding wire 32 is the nano copper wire, the thermal conductive layer formed by the copper foil and the nano copper wire is also referred to as a nano hook-and-loop fastener. In this way, copper in the nano copper wire diffuses into the surfaces of the heat sink 10 and the power semiconductor package 20 and forms molecular bonding force with strong binding force with the copper layer or the aluminum layer on the surfaces of the heat sink 10 and the power semiconductor package 20, which can firmly fasten the heat sink 10 to the power semiconductor package 20. In addition, both the copper foil and the nano copper wire have good heat conductivity and can greatly improve a heat dissipation capability of the power semiconductor module.

When the metal bonding wires 32 are disposed on the metal thermal conductive sheet 31, the metal bonding wires 32 may be grown on the metal thermal conductive sheet 31 by using a nano copper wire growth process. For example, in this embodiment, when the metal bonding wire 32 is the nano copper wire, and when the metal thermal conductive sheet 31 is the copper foil, the nano copper wire may be grown on upper and lower surfaces of the copper foil by using a chemical vapor deposition method.

In this embodiment, when the thermal conductive layer 30 is the thermal conductive material having metal bonding wires 32 (refer to FIG. 3A) on a surface, the heat sink 10 and the power semiconductor package 20 may need to be placed at a high temperature and face high pressure applied, so that the metal bonding wires 32 are in the bonding connections to the copper layer or the aluminum layer on the surfaces of the heat sink 10 and the power semiconductor package 20, thereby implementing good fastening effect between the heat sink 10 and the thermal conductive layer 30 and between the power semiconductor package 20 and the thermal conductive layer 30.

However, the high temperature and high pressure make it more difficult to assemble the power semiconductor module. Therefore, in this embodiment, to reduce the temperature and pressure required for combining the heat sink 10, the power semiconductor package 20, and the thermal conductive layer 30, as shown in FIG. 3B, the thermal conductive layer 30 further includes thermal conductive adhesive 33, and the thermal conductive adhesive 33 is distributed in a gap between adjacent metal bonding wires 32. In this way, the thermal conductive adhesive 33 helps closely adhere the thermal conductive layer 33 to the heat sink 10 (for example, the first heat sink 11 and the second heat sink 12) and the power semiconductor package 20. In this way, when the heat sink 10, the power semiconductor package 20, and the thermal conductive layer 30 are fastened under the conditions of heating and pressing, under the action of the thermal conductive adhesive 33, the good fastening effect can be achieved between the heat sink 10 and the thermal conductive layer 30 and between the power semiconductor package 20 and the thermal conductive layer 30 under process conditions of a lower temperature and lower pressure. Therefore, the thermal conductive adhesive is disposed, so that the temperature and pressure for performing heating and pressing processing on the heat sink 10, the power semiconductor package 20, and the thermal conductive layer 30 are reduced, which helps improve a yield of the process.

It should be noted that the thermal conductive adhesive 33 may be in a colloidal or liquid state. Therefore, when the thermal conductive adhesive 33 is distributed between the metal bonding wires 32, the thermal conductive adhesive 33 may be in contact with the metal thermal conductive sheet 31. Alternatively, as shown in FIG. 3B, when the heating or pressing processing is not performed, the thermal conductive adhesive 33 is distributed between adjacent metal bonding wires 32 but is not in contact with the metal thermal conductive sheet 21. When the thermal conductive layer 30, the heat sink 10, and the power semiconductor package 20 are heated or pressed, the thermal conductive adhesive 30 is in close contact with the metal thermal conductive sheet 21, thereby implementing rapid heat transmission.

In this embodiment, a type of the thermal conductive adhesive 33 is not limited, and any adhesive that has a heat conduction function and can be adhered to the heat sink 10 and the power semiconductor package 20 to implement fastening may be selected for use.

In this embodiment, as shown in FIG. 1, there may be two heat sinks 10, and the two heat sinks 10 are respectively the first heat sink 11 and the second heat sink 12 that are opposite to each other. The power semiconductor package 20 is disposed between the first heat sink 11 and the second heat sink 12, the thermal conductive layer 30 is disposed between the power semiconductor package 20 facing the first heat sink 11 and the first heat sink 11, and the thermal conductive layer 30 is disposed between the power semiconductor package 20 facing the second heat sink 12 and the second heat sink 12.

The power semiconductor package 20 is disposed between the first heat sink 11 and the second heat sink 12 to form the power semiconductor module with a double side cooling structure, and heat can be bidirectionally transferred from the two surfaces of the power semiconductor package 20 to the first heat sink 11 and the second heat sink 12. Compared with a single side cooling structure, the double side cooling structure has a stronger heat dissipation capability under a same process condition, which helps bring performance of a power semiconductor chip into full play, improve product power density, and reduce product costs.

In some examples, one heat sink 10 may also be disposed to cool a single side of the power semiconductor package 20.

In this embodiment, as shown in FIG. 1, one end of the first heat sink 11 and one end of the second heat sink 12 are connected by using a connecting plate 13, and the other end of the first heat sink 11 and the other end of the second heat sink 12 are connected by using a fastener. In some examples, the other end of the first heat sink 11 and the other end of the second heat sink 12 may be connected without using a fastener.

In an implementation, as shown in FIG. 1 to FIG. 3C, a connected heat dissipation water channel 14 is disposed inside each of the first heat sink 11, the second heat sink 12, and the connecting plate 13, and a water inlet 111 and a water outlet 121 that communicate with the heat dissipation water channels 14 are respectively disposed at the other end of the first heat sink 11 and the other end of the second heat sink 12.

The heat dissipation water channel 14 inside the first heat sink 11 communicates with the heat dissipation water channel 14 inside the second heat sink 12 through the heat dissipation water channel (not shown) inside the connecting plate 13, and the heat dissipation water channels 14 inside the first heat sink 11 and the second heat sink 12 form the heat dissipation water channels connected in series.

As shown in FIG. 1, the water inlet 111 and the water outlet 121 may be located on a same side of the heat sinks 10, and a coolant enters the heat dissipation water channel 14 inside the first heat sink 11 from the water inlet 111 to absorb heat of the first heat sink 11. Then, the coolant flows into the heat dissipation water channel 14 of the second heat sink 12 through the heat dissipation water channel in the connecting plate 13 to absorb heat of the second heat sink 12, and finally flows out of the water outlet 121 to take away all the heat.

It should be noted that, in this embodiment, the water inlet 111 is disposed on the first heat sink 11, and the water outlet 121 is disposed on the second heat sink 12. In some examples, the water inlet 111 may alternatively be disposed on the second heat sink 12, and the water outlet 121 is disposed on the first heat sink 11. In addition, positions of disposing the water inlet 111 and the water outlet 121 include, but are not limited to, the positions shown in FIG. 1.

In an implementation, as shown in FIG. 2 and FIG. 3C, each power semiconductor package 20 includes at least a first substrate 21, a second substrate 22, and at least one chip. The chip may include an IGBT chip 23 and a diode chip 24. Alternatively, in some examples, the chip may alternatively be a silicon (Si) metal-oxide-semiconductor field-effect transistor (Metal-Oxide-Semiconductor Field-Effect Transistor, MOSFET) or a silicon carbide (SiC) metal-oxide-semiconductor field-effect transistor (MOSFET).

A circuit is formed among the IGBT chip 23, the first substrate 21, and the second substrate 22, a circuit is formed among the diode chip 24, the first substrate 21, and the second substrate 22, and a parallel circuit is formed between the IGBT chip 23 and the diode chip 24.

In this embodiment, the thermal conductive layer 30 is disposed between the heat sink 10 and the first substrate 21 and/or between the heat sink 10 and the second substrate 22, and the thermal conductive layer 30 is configured to transfer heat generated by the power semiconductor package 20 to the heat sink 10.

When the chip is the silicon metal-oxide-semiconductor field-effect transistor or the silicon carbide metal-oxide-semiconductor field-effect transistor, for disposing of the chip, refer to the manners of disposing the IGBT chip 23 and the diode chip 24.

An example in which the chip includes the IGBT chip 23 and the diode chip 24 may be used for description below.

In an implementation, as shown in FIG. 2 to FIG. 3C, the power semiconductor package 20 further includes at least one conductive pad, and the conductive pad is configured to electrically connect the chip to the first substrate 21. For example, as shown in FIG. 2, the power semiconductor package 20 includes at least one first conductive pad 25 and at least one second conductive pad 26, and the conductive pad conducts electricity and supports the first substrate 21 and the second substrate 22.

The first conductive pad 25 is located between the IGBT chip 23 and the first substrate 21, and two sides of the first conductive pad 25 are respectively connected to the IGBT chip 23 and the first substrate 21 by using conductive connecting layers 212.

The second conductive pad 26 is located between the diode chip 24 and the first substrate 21, and two sides of the second conductive pad 26 are respectively connected to the diode chip 24 and the first substrate 21 by using conductive connecting layers 212.

In this embodiment, the conductive connecting layer 212 is a solder layer or a sintering layer that has electricity conductivity.

In an implementation, as shown in FIG. 2 and FIG. 3, the first substrate 21 has a first conductive area 2106 and a second conductive area 2107 that are insulated from each other and arranged side by side, the second substrate 22 has a third conductive area 2206 and a fourth conductive area 2207 that are insulated from each other and arranged side by side, and the first conductive area 2106 is opposite to the third conductive area 2206, and the second conductive area 2107 is opposite to the fourth conductive area 2207.

A part of the IGBT chip 23 and a part of the diode chip 24 are located between the first conductive area 2106 and the third conductive area 2206, and the other part of the IGBT chip 23 and the other part of the diode chip 24 are located between the second conductive area 2107 and the fourth conductive area 2207.

The first conductive area 2106 and the third conductive area 2206 are connected by using the IGBT chip 23 and the diode chip 24, and the second conductive area 2107 and the fourth conductive area 2207 are connected by using the IGBT chip 23 and the diode chip 24. To enable the first conductive area 2106, the second conductive area 2107, the third conductive area 2206, and the fourth conductive area 2207 to be connected, the first conductive area 2106 of the first substrate 21 is connected to the fourth conductive area 2207 of the second substrate 22. In this way, the third conductive area 2206, the first conductive area 2106, the fourth conductive area 2207, and the second conductive area 2107 are connected. The IGBT chip 23 and the diode chip 24 are connected in parallel. In this way, after one of the conductive areas in the first substrate 21 is electrically connected to a positive electrode of an electrode terminal, and one of the conductive areas in the second substrate 22 is electrically connected to a negative electrode of an electrode terminal, the third conductive area 2206, the first conductive area 2106, the fourth conductive area 2207, and the second conductive area 2107 form a loop with the two electrode terminals, and may simultaneously supply power to a plurality of IGBT chips and a plurality of diode chips 24.

Alternatively, to enable the first conductive area 2106, the second conductive area 2107, the third conductive area 2206, and the fourth conductive area 2207 to be connected, the second conductive area 2107 and the third conductive area 2206 may be connected, and the first conductive area 2106, the third conductive area 2206, the second conductive area 2107, and the fourth conductive area 2207 may be connected.

In this embodiment, an example in which the first conductive area 2106 and the fourth conductive area 2207 are connected is used for description. The connection manner between the first conductive area 2106 and the fourth conductive area 2207 is described in detail below.

In an implementation, as shown in FIG. 2 to FIG. 3C, the first substrate 21 includes a first conductive layer 2103 and a first insulation plate 2104, and the first conductive layer 2103 is located on a surface that is of the first insulation plate 2104 and that faces the IGBT chip 23.

The second substrate 22 includes a second conductive layer 2203 and a second insulation plate 2204, and the second conductive layer 2203 is located on a surface that is of the second insulation plate 2204 and that faces the IGBT chip 23.

The first conductive layer 2103 at least includes the first conductive area 2106 and the second conductive area 2107, and the second conductive layer 2203 at least includes the third conductive area 2206 and the fourth conductive area 2207.

The first insulation plate 2104 and the second insulation plate 2204 are respectively configured to prevent the first conductive layer 2103 and the second conductive layer 2203 from being connected to the heat sink 10.

In an implementation, as shown in FIG. 2 to FIG. 3C, the first substrate 21 further includes a first copper layer 2105, and the first copper layer 2105 plays a role in protection and heat conduction. The first copper layer 2105 is located on a surface that is of the first insulation plate 2104 and that faces the thermal conductive layer 30. For example, as shown in FIG. 3C, the first insulation plate 2104 is located between the first copper layer 2105 and the first conductive layer 2103, and the first copper layer 2105 is configured to protect the first insulation plate 2104, prevents the first insulation plate 2104 from breaking, and has a heat conduction function.

The second substrate 22 further includes a second copper layer 2205, and the second copper layer 2205 plays a role in protection and heat conduction. The second copper layer 2205 is located on a surface that is of the second insulation plate and that faces the thermal conductive layer 30. For example, as shown in FIG. 3C, the second insulation plate 2204 is located between the second copper layer 2205 and the second conductive layer 2203. The second copper layer 2205 is configured to protect the second insulation plate 2204, prevents the second insulation plate 2204 from breaking, and has a heat conduction function.

The second insulation plate 2204 and the first insulation plate 2104 may be made of ceramic materials. In this way, the first substrate 21 formed by the first insulation plate 2104, the first copper layer 2105, and the first conductive layer 2103, and the second substrate 22 formed by the second insulation plate 2204, the second copper layer 2205, and the second conductive layer 2203 are both direct bonding copper (DBC) substrates.

Materials of the second insulation plate 2204 and the first insulation plate 2104 may include, but are not limited to, the ceramic materials and may alternatively be plates made of other insulation materials.

The thermal conductive layer 30 is disposed between the heat sink 10 and the first copper layer 2105 and/or between the heat sink 10 and the second copper layer 2205. For example, as shown in FIG. 3C, when there are two heat sinks 10, the thermal conductive layer 30 is disposed between one heat sink 10 (for example, the first heat sink 11) and the first copper layer 2105, and the thermal conductive layer 30 is also disposed between the other heat sink 10 (for example, the second heat sink 12) and the second copper layer 2205. When there is one heat sink 10, the thermal conductive layer 30 is disposed between the heat sink 10 and the first copper layer 2105 or between the heat sink 10 and the second copper layer.

It should be noted that, when the first copper layer 2105 and the second copper layer 2205 are disposed, and when the thermal conductive layer 30 is the nano copper hook-and-loop fastener, the copper in the nano copper wire on the surface of the nano copper hook-and-loop fastener can diffuse into the first copper layer 2105 and/or the second copper layer 2205 and form molecular bonding force of Cu—Cu metallic bonding with copper in the first copper layer 2105 and/or the second copper layer 2205. Therefore, stronger binding force between the thermal conductive layer 30 and the first copper layer 2105 and/or between the thermal conductive layer 30 and the second copper layer 2205 is obtained, and a problem that heat conduction effect is reduced by delamination between the thermal conductive layer 30 and the first substrate 21 and/or between the thermal conductive layer 30 and the second substrate 22 is not easy to occur.

In an implementation, as shown in FIG. 1 to FIG. 4, the power semiconductor package 20 further includes a wiring terminal 27, one end of the wiring terminal 27 has a first terminal 2701 and a second terminal 2702, one of the first terminal 2701 and the second terminal 2702 is electrically connected to the first conductive area 2106, and the other of the first terminal 2701 and the second terminal 2702 is connected to the fourth conductive area 2207, so that the first conductive area 2106 is connected to the fourth conductive area 2207 by using the first terminal 2701 and the second terminal 2702 of the wiring terminal 27.

Alternatively, one of the first terminal 2701 and the second terminal 2702 is electrically connected to the second conductive area 2107, and the other of the first terminal 2701 and the second terminal 2702 is electrically connected to the third conductive area 2206, so that the second conductive area 2107 is connected to the third conductive area 2206 by using the first terminal 2701 and the second terminal 2702 of the wiring terminal 27.

In this embodiment, an example in which the first terminal 2701 is electrically connected to the first conductive area 2106, and the second terminal 2702 is electrically connected to the fourth conductive area 2207 is used for description.

In an implementation, as shown in FIG. 2, the power semiconductor package 20 further includes a first electrode terminal 28 and a second electrode terminal 29, one of the first electrode terminal 28 and the second electrode terminal 29 is a positive terminal, and the other of the first electrode terminal 28 and the second electrode terminal 29 is a negative terminal.

One of the first electrode terminal 28 and the second electrode terminal 29 is electrically connected to the first conductive area 2106, and the other of the first electrode terminal 28 and the second electrode terminal 29 is electrically connected to the fourth conductive area 2207.

Alternatively, one of the first electrode terminal 28 and the second electrode terminal 29 is electrically connected to the second conductive area 2107, and the other of the first electrode terminal 28 and the second electrode terminal 29 is electrically connected to the third conductive area 2206.

In this embodiment, an example in which the first electrode terminal 28 is the positive terminal and is electrically connected to the third conductive area 2206; and the second electrode terminal 29 is the negative terminal and is electrically connected to the second conductive area 2107 is used for description.

Figure 4:
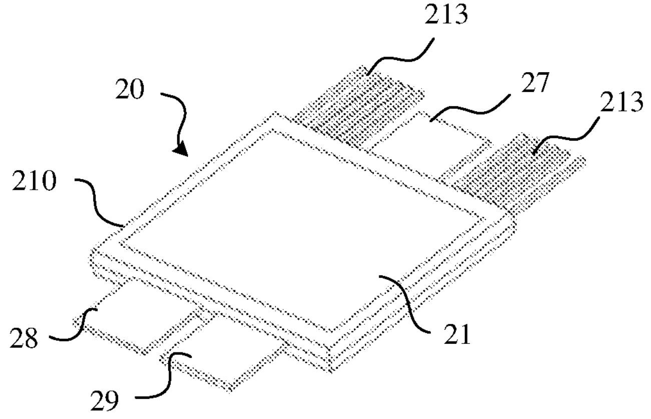
FIG. 4 is a schematic diagram of a structure of a power semiconductor package according to an embodiment.

In an implementation, as shown in FIG. 4, the power semiconductor package 20 further includes a packaging layer 210, and the first substrate 21, the second substrate 22, at least one IGBT chip 23, and at least one diode chip 24 are located in the packaging layer 210. Components such as the first substrate 21, the second substrate 22, the IGBT chip 23, and the diode chip 24 are packaged into a sealed overall structure by using the packaging layer 210, so that the chips in the formed power semiconductor package 20 are not easily damaged by water vapor or liquid.

When the thermal conductive layer 30 uses the nano copper hook-and-loop fastener, to generate the molecular bonding force on a bonding surface between the thermal conductive layer 30 and the power semiconductor package 20, surfaces that are of the first substrate 21 and the second substrate 22 and that face the thermal conductive layer 30 need to be exposed at the packaging layer 210, so that the nano copper hook-and-loop fastener is enabled to be in contact with the copper layer on the surfaces of the first substrate 21 and the second substrate 22. For example, as shown in FIG. 4, at least a part of an area that is of the packaging layer 210 and that is opposite to the first substrate 21 and the second substrate 22 is an exposed area (for example, may be a hollow area), and the surfaces that are of the first substrate 21 and the second substrate 22 and that respectively face the thermal conductive layer 30 are exposed in the exposed area. In this way, blocking of the packaging layer 210 is eliminated, and the first substrate 21 and the second substrate 22 are respectively in direct contact with the thermal conductive layer 30, which is beneficial to heat transfer and close contact with the thermal conductive layer 30.

In some examples, when there is one heat sink 10, at least a part of a surface that is of the packaging layer 210 and that is opposite to the heat sink 10 may be set as the exposed area. For example, at least a part of an area that is of the first substrate 21 and that is opposite to the packaging layer 210 may be set as the exposed area, the thermal conductive layer is disposed between the first substrate 21 and the heat sink 10, and an area that is of the packaging layer 210 and that is opposite to the second substrate 22 is a closed area.

It should be noted that structures of the power semiconductor module shown in FIG. 2 and FIG. 3C are partial structural views of the structures of the power semiconductor module. The packaging layer 210 is not shown in FIG. 2 and FIG. 3C. However, in an actual product, the packaging layer 210 of the power semiconductor module may be shown in FIG. 4.

In this embodiment, as shown in FIG. 2, there may be two IGBT chips 23 and three diode chips 24 between the first conductive area 2106 and the third conductive area 2206 and between the second conductive area 2107 and the fourth conductive area 2207. In some examples, a quantity of IGBT chips 23 and a quantity of diode chips 24 include, but are not limited to, the foregoing quantities.

In an implementation, as shown in FIG. 1, FIG. 2, and FIG. 4, the power semiconductor package 20 further includes a signal terminal 213, one end of the signal terminal 213 is located in the packaging layer 210 and is electrically connected to the IGBT chip 23, and the other end of the signal terminal 213 is located outside the packaging layer 210 (as shown in FIG. 4).

In an implementation, as shown in FIG. 2 and FIG. 3C, the power semiconductor package 20 further includes a bonding wire 211, and the bonding wire 211 may be, for example, a lead. A soldering pad 2209 is disposed at one end of the second substrate 22, one end of the bonding wire 211 is electrically connected to the soldering pad 2209 in a bonding manner, and the other end of the bonding wire 211 may also be electrically connected to the IGBT chip 23 in a bonding manner. One end of the signal terminal 213 is electrically connected to the soldering pad 2209, so that the IGBT chip 23 is connected to the signal terminal 213.

It should be noted that the bonding manner is an existing manner of connecting the metal wire to the soldering pad, and the metal wire is closely welded to the soldering pad by using heat, pressure, or ultrasonic energy. In some other examples, the two ends of the bonding wire 211 may be electrically connected to the soldering pad 2209 and the IGBT chip 23 in another manner, for example, the connection is performed by using conductive adhesive or through welding.

It should be noted that, as shown in FIG. 3C, the soldering pad 2209 and the second conductive layer 2203 of the second substrate 22 are disposed at a spacing, to ensure that the soldering pad 2209 and the second conductive layer 2203 of the second substrate 22 are insulated from each other.

Embodiment 2

Figure 5A:
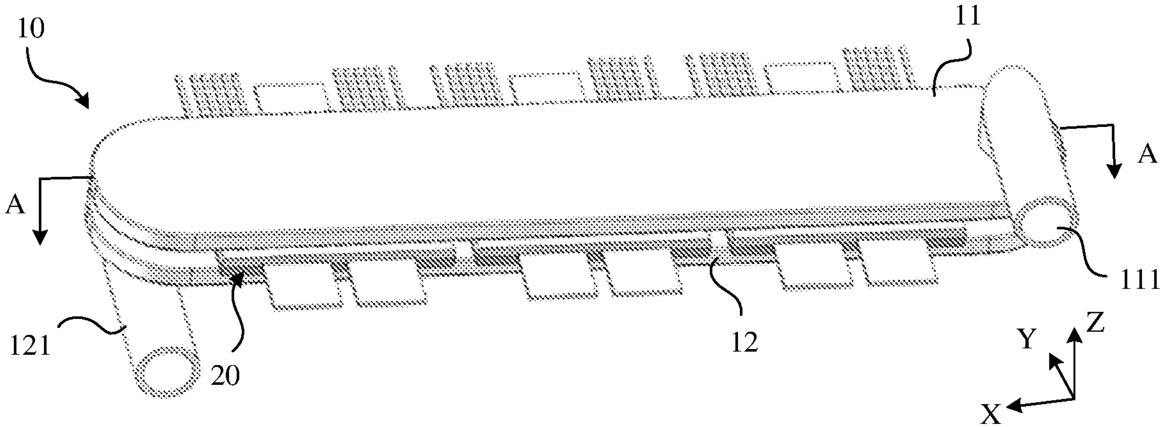
FIG. 5A is a schematic diagram of a structure of a power semiconductor module according to an embodiment.

FIG. 5A is a schematic diagram of another structure of a power semiconductor module according to an embodiment.

Figure 5B:
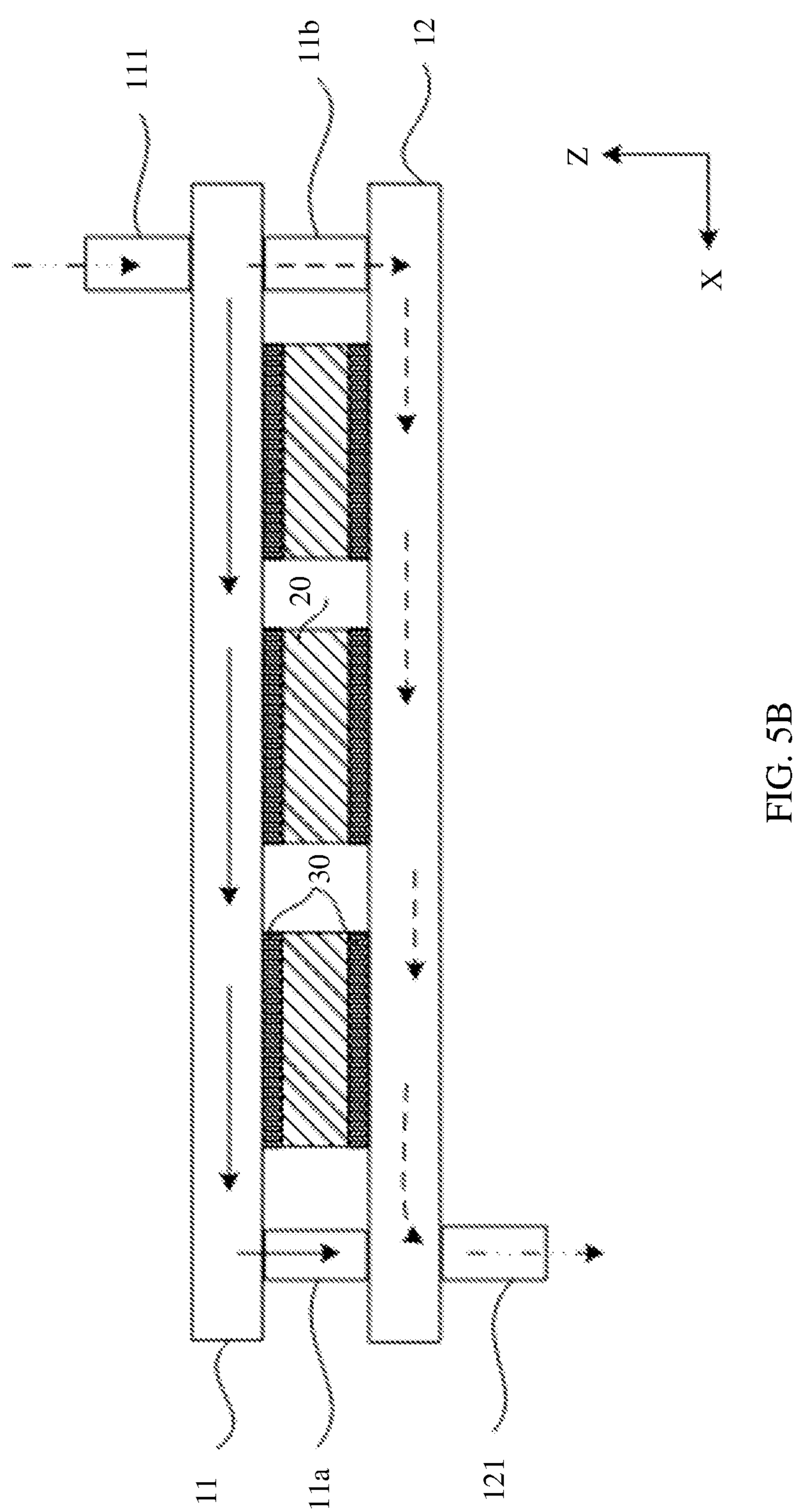
FIG. 5B is a schematic diagram of a sectional view in an A-A direction in FIG. 5A.

A difference between this embodiment and Embodiment 1 lies in that: In this embodiment, as shown in FIG. 5A, two ends of the first heat sink 11 and the second heat sink 12 are connected through connecting pipes. For example, as shown in FIG. 5B, one end of the first heat sink 11 communicates with one end of the second heat sink 12 by using a connecting pipe 11*b*, and the other end of the first heat sink 11 communicates with one end of the second heat sink 12 by using a connecting pipe 11*a*. The heat dissipation water channel 14 (refer to FIG. 6) is disposed both inside the first heat sink 11 and the second heat sink 12, the heat dissipation water channels 14 in the first heat sink 11 and the second heat sink 12 are connected in parallel by using the connecting pipe 11*a* and the connecting pipe 11*b*, and the water inlet 111 is disposed at one end of the first heat sink 11, and the water outlet 121 is disposed at one end that is of the second heat sink 12 and that is away from the water inlet 111.

Figure 6:
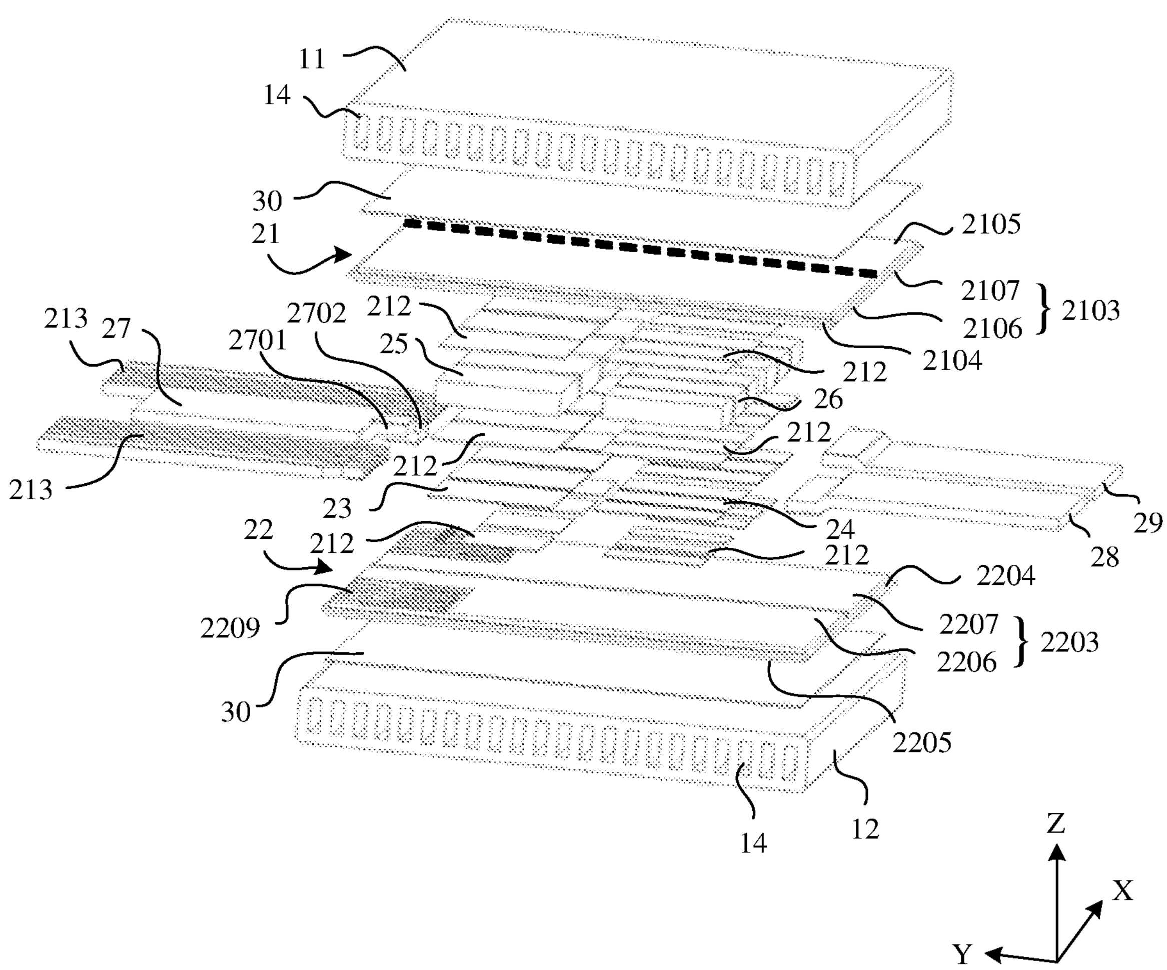
FIG. 6 is a schematic diagram of an exploded partial sectional view of a power semiconductor module according to an embodiment.

During cooling, as shown by arrows in FIG. 5B, a coolant enters the heat dissipation water channel 14 (as shown in FIG. 6) inside the first heat sink 11 from the water inlet 111, a part of the coolant flows along solid line arrows in FIG. 5B on the heat dissipation water channel 14 of the first heat sink 11 to absorb heat of the first heat sink 11, and enters the water outlet 121 by using the connecting pipe 11*a* adjacent to the water outlet 121 side to take away the heat. The other part of the coolant enters the heat dissipation water channel 14 inside the second heat sink 12 along dashed line arrows in FIG. 5B by using the connecting pipe 11*b* adjacent to the water inlet 111 side, flows along the heat dissipation water channel 14 (as shown in FIG. 6) of the second heat sink to absorb heat of the second heat sink 12, and then enters the water outlet 121 to take away the heat.

In this way, the coolant in the first heat sink 11 cools one side of the power semiconductor package 20 and is discharged from the water outlet 121, and a part of the coolant entering the water inlet 111 directly enters the second heat sink 12 to cool the other side of the power semiconductor package 20. The heat dissipation water channels 14 in the two heat sinks are disposed in parallel by using the connecting pipe 11*b* and the connecting pipe 11*a*. In this way, good heat dissipation effect is implemented on the two sides of the power semiconductor package 20, and a good heat dissipation capability of the power semiconductor module is ensured.

Embodiment 3

Figure 7:
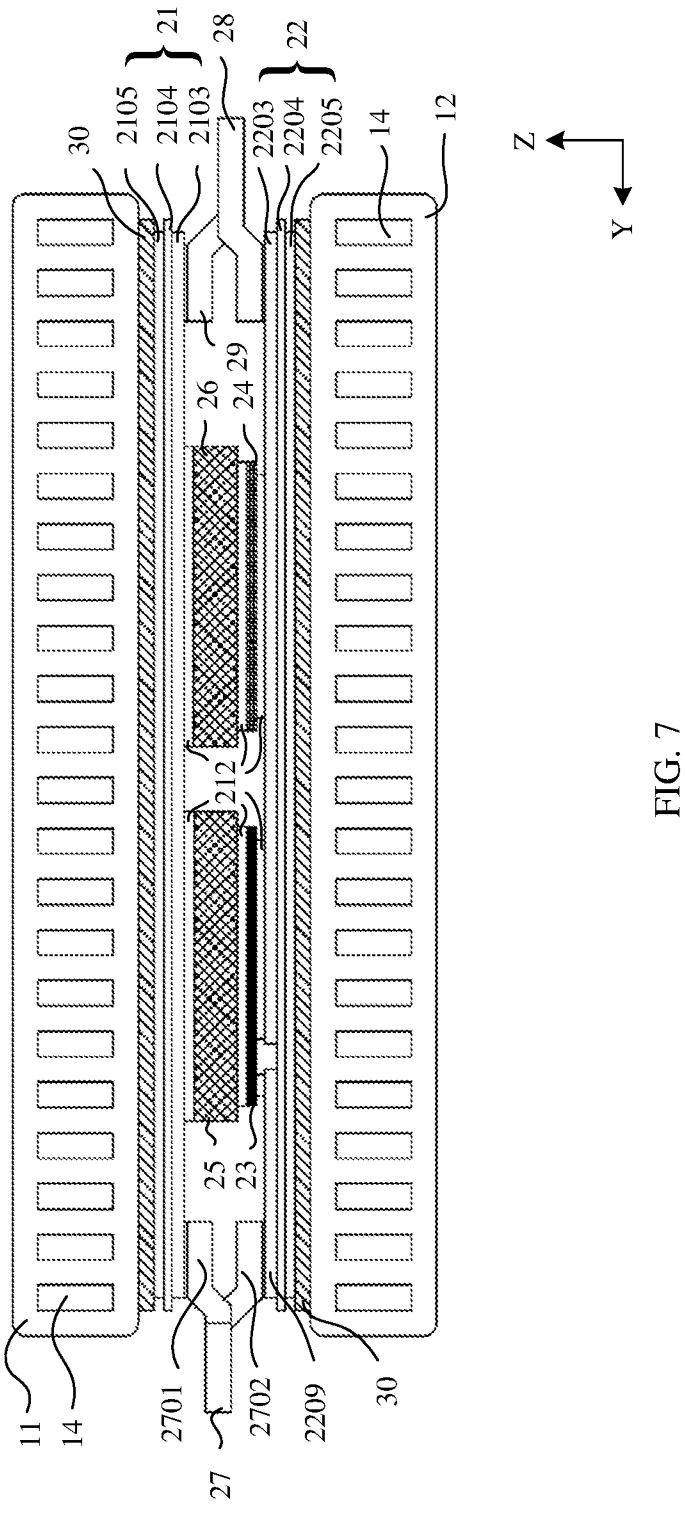
FIG. 7 is a schematic diagram of a sectional view of a power semiconductor module obtained after the power semiconductor module in FIG. 6 is assembled.

FIG. 6 is a schematic diagram of another structure of a power semiconductor module according to an embodiment, and FIG. 7 is a schematic diagram of a sectional structure of a power semiconductor module obtained after the power semiconductor module in FIG. 6 is assembled.

A difference between this embodiment and the foregoing embodiments lies in that: In the foregoing embodiments, the IGBT chip 23 and the diode chip 24 are assembled in a face-up manner, that is, front faces of the IGBT chip 23 and the diode chip 24 face upward. However, in this embodiment, as shown FIG. 6 and FIG. 7, the IGBT chip 23 and the diode chip 24 are assembled in a flip-chip manner, that is, the front faces of the IGBT chip 23 and the diode chip 24 face downwards. The soldering pad 2209 is disposed at one end of the second substrate 22, and as shown in FIG. 7, the IGBT chip 23 is electrically connected to the soldering pad 2209 (for example, electrically connected in a welding manner), that is, the IGBT chip 23 is not electrically connected to the soldering pad 2209 by using the bonding wire 211 (as shown in FIG. 2). One end of the signal terminal 213 is electrically connected to the soldering pad 2209, so that the IGBT chip 23 is finally connected to the signal terminal 213.

In this embodiment, the soldering pad 2209 and the second conductive layer 2203 of the second substrate 22 are disposed at a spacing, to ensure that the soldering pad 2209 and the second conductive layer 2203 of the second substrate 22 are disposed to be insulated from each other.

The manner of connecting the IGBT chip 23 to the first conductive pad 25 and the manner of connecting the diode chip 24 to the second conductive pad 26, and another structure are the same as those in the foregoing embodiments. For details, refer to the foregoing embodiments, and details are not described in this embodiment.

Embodiment 4

Figure 8:
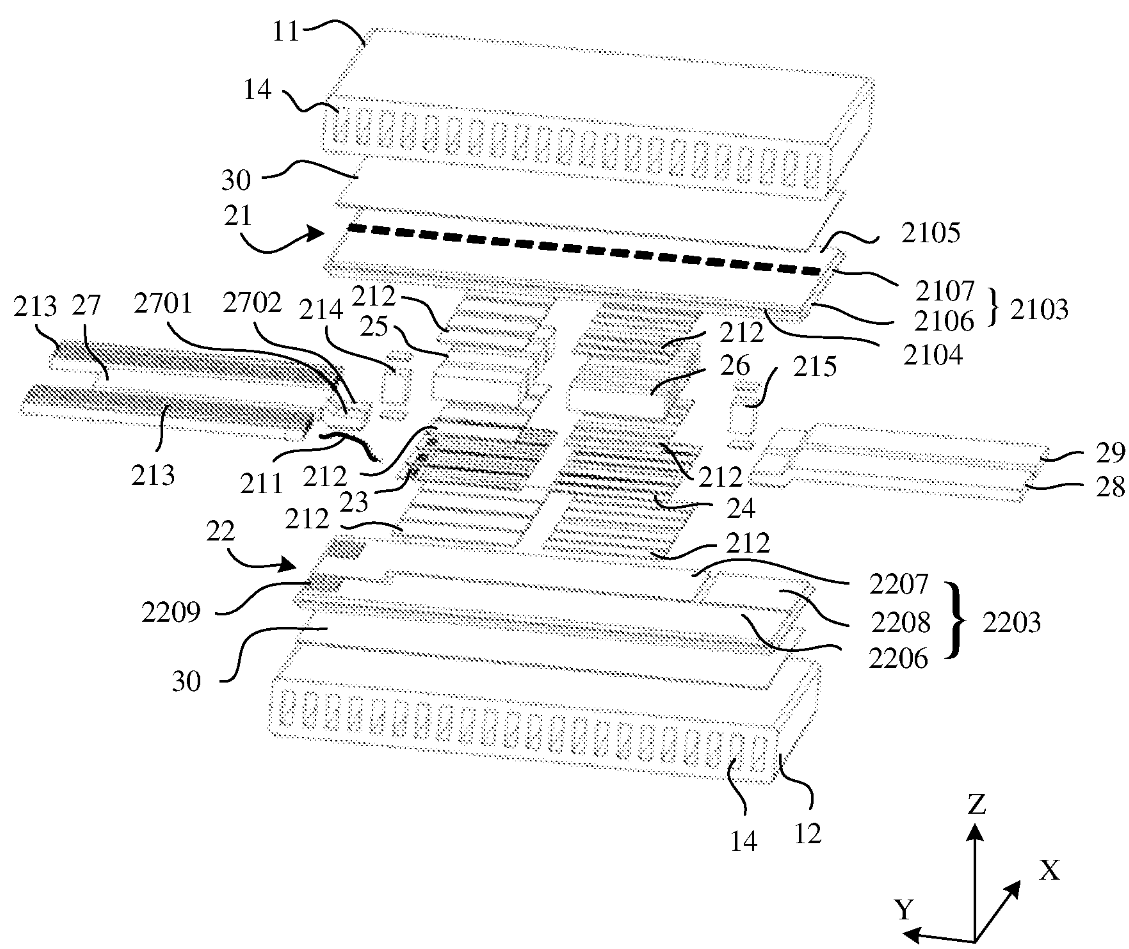
FIG. 8 is a schematic diagram of an exploded partial sectional view of a power semiconductor module according to an embodiment.
Figure 9:
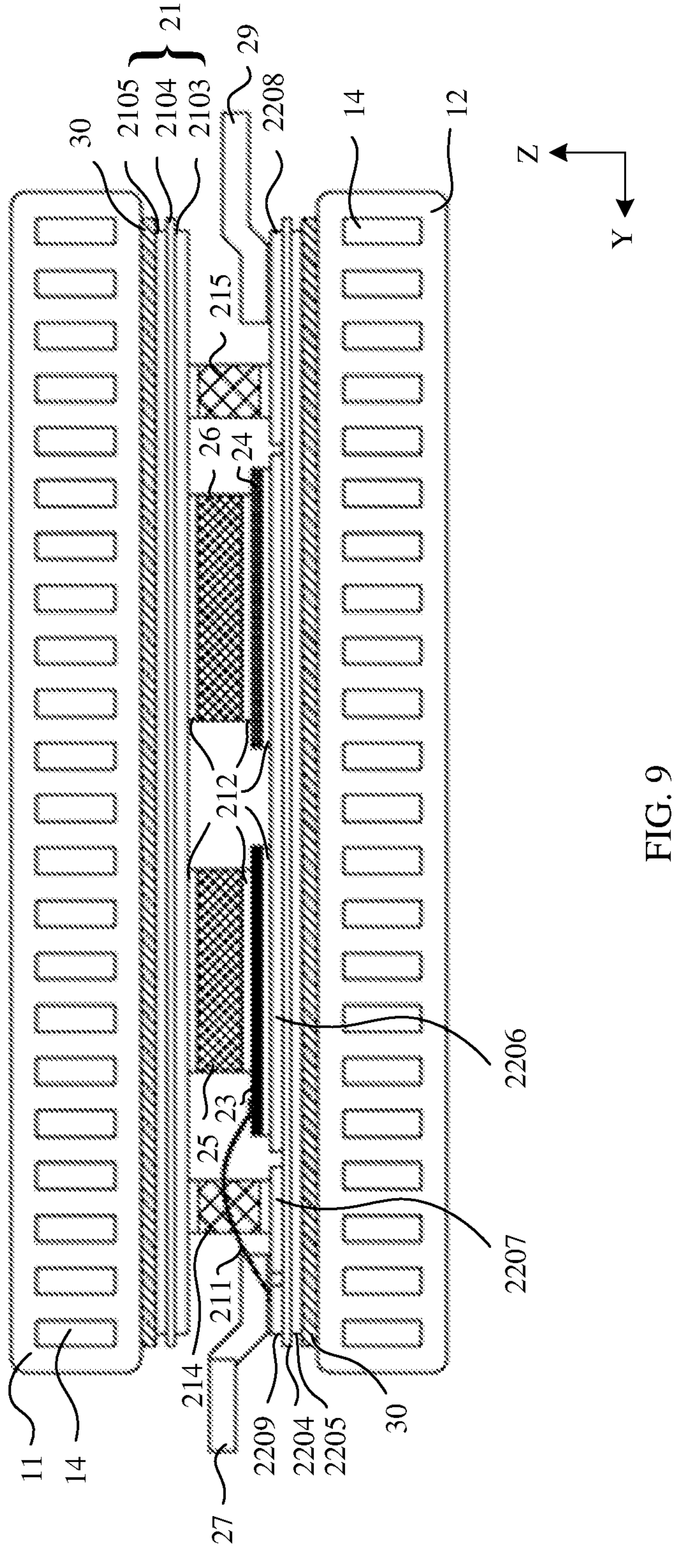
FIG. 9 is a schematic diagram of a sectional view of a power semiconductor module obtained after the power semiconductor module in FIG. 8 is assembled.

FIG. 8 is a schematic diagram of another structure of a power semiconductor module according to an embodiment, and FIG. 9 is a schematic diagram of a structure obtained after the parts in FIG. 8 are assembled.

A difference between this embodiment and the foregoing embodiments lies in that: In this embodiment, as shown in FIG. 8 and FIG. 9, the power semiconductor package 20 further includes a first conductive column 214 and a second conductive column 215, and the first conductive column 214 and the second conductive column 215 are separately located between the first substrate 21 and the second substrate 22.

The second substrate 22 further has a fifth conductive area 2208, and as shown in FIG. 8 and FIG. 9, the fifth conductive area 2208 is disposed at a distance from the third conductive area 2206 and the fourth conductive area 2207, to ensure that the fifth conductive area 2208, the third conductive area 2206, and the fourth conductive area 2207 are disposed to be insulated from each other.

Both the first terminal 2701 and the second terminal 2702 of the wiring terminal 27 are electrically connected to the fourth conductive area 2207, two ends of the first conductive column 214 are electrically connected to the fourth conductive area 2207 and the first conductive area 2106 respectively, and two ends of the second conductive column 215 are electrically connected to the second conductive area 2107 and the fifth conductive area 2208 respectively. In this way, the first conductive area 2106, the second conductive area 2107, the third conductive area 2206, the fourth conductive area 2207, and the fifth conductive area 2208 are connected by using the first conductive column 214 and the second conductive column 215.

One of the first electrode terminal 28 and the second electrode terminal 29 is electrically connected to the third conductive area 2206, and the other of the first electrode terminal 28 and the second electrode terminal 29 is electrically connected to the fifth conductive area 2208. For example, in FIG. 8, the first electrode terminal 28 is electrically connected to the third conductive area 2206, and the second electrode terminal 29 is electrically connected to the fifth conductive area 2208.

The third conductive area 2206, the first conductive area 2106, the fourth conductive area 2207, the second conductive area 2107, and the fifth conductive area 2208 are connected by using the first conductive column 214 and the second conductive column 215 and form a conductive loop with the first electrode terminal 28 and the second electrode terminal 29.

For another structure in this embodiment, refer to the connection manner in the foregoing embodiments, and details are not described again in this embodiment.

Embodiment 5

Figure 10:
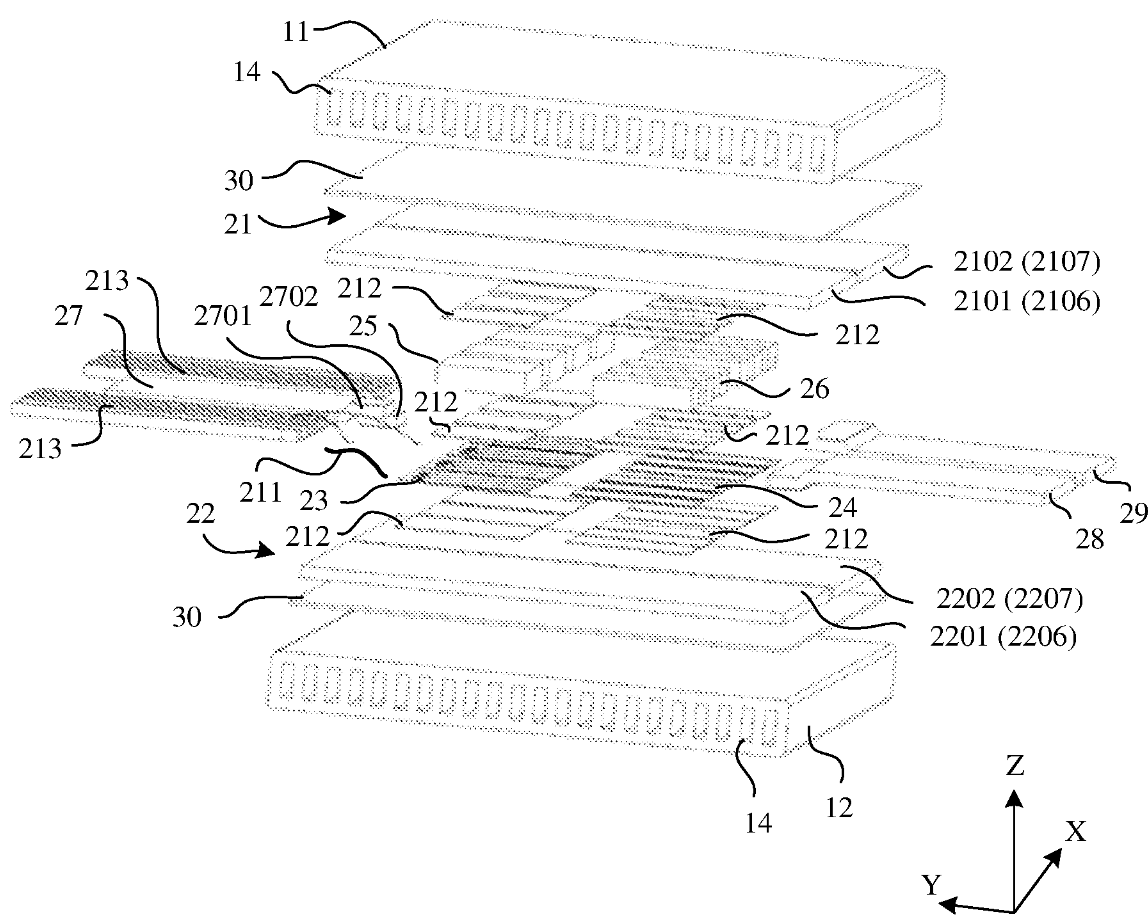
FIG. 10 is a schematic diagram of an exploded partial sectional view of a power semiconductor module according to an embodiment.
Figure 11:
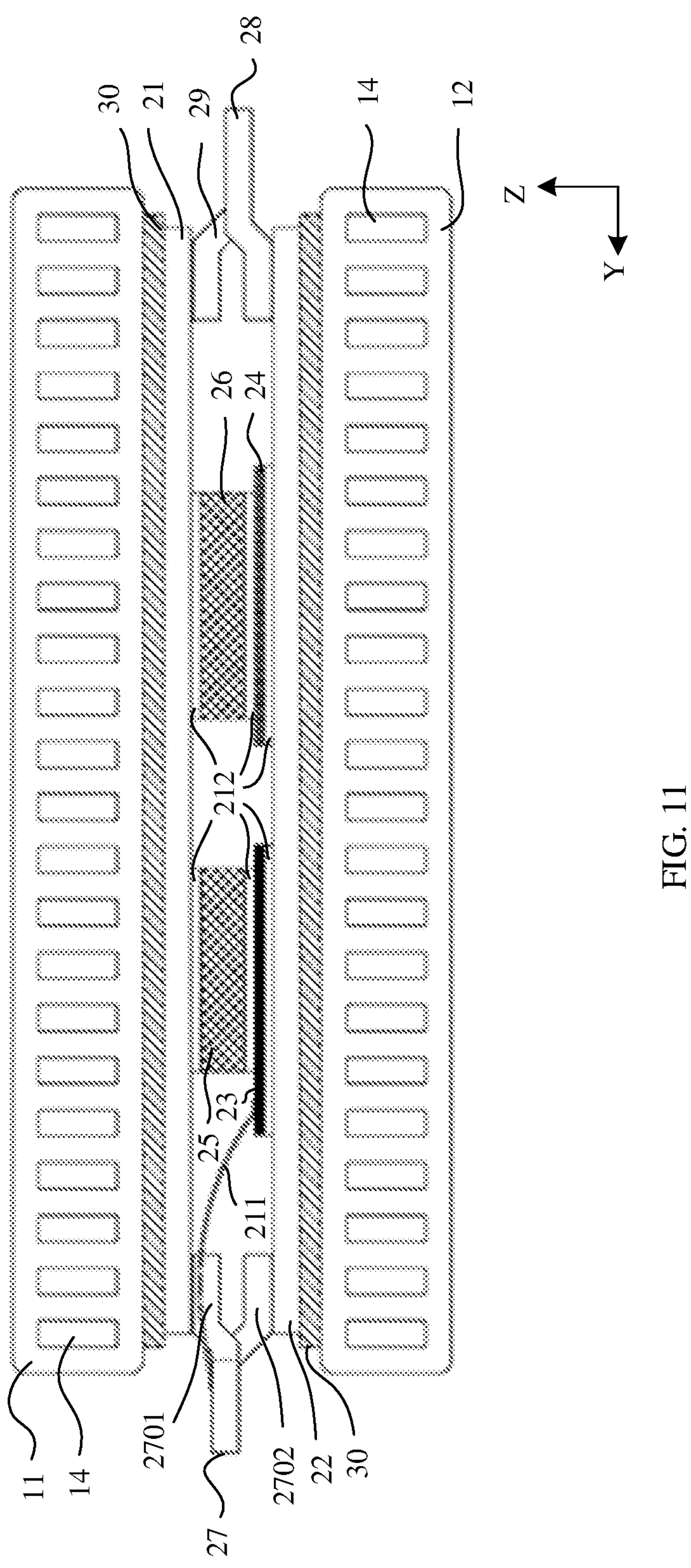
FIG. 11 is a schematic diagram of a sectional view of a power semiconductor module obtained after the power semiconductor module in FIG. 10 is assembled.

FIG. 10 is a schematic diagram of another structure of a power semiconductor module according to an embodiment, and FIG. 11 is a schematic diagram of a structure obtained after the parts in FIG. 10 are assembled.

A difference between this embodiment and the foregoing embodiments lies in that: In this embodiment, as shown in FIG. 10, both the first substrate 21 and the second substrate 22 are conductive plates. For example, the first substrate 21 and the second substrate 22 may be copper plates. The first substrate 21 and the second substrate 22 may alternatively be metal conductive plates made of other metal materials with good electricity conductivity and heat conductivity.

The first substrate 21 includes a first conductive plate 2101 and a second conductive plate 2102 that are insulated from each other and arranged side by side, the first conductive plate 2101 has the first conductive area 2106, and the second conductive plate 2102 has the second conductive area 2107.

The second substrate 22 includes a third conductive plate 2201 and a fourth conductive plate 2202 that are insulated from each other and arranged side by side, the third conductive plate 2201 has the third conductive area 2206, and the fourth conductive plate 2202 has the fourth conductive area 2207.

When the first substrate 21 and the second substrate 22 are the conductive plates, the heat sink 10 is disposed to be insulated from the first substrate 21 and/or from the second substrate 22, to avoid a connection between the conductive plate and the heat sink 10.

In this embodiment, to dispose the heat sink 10 (for example, the first heat sink 11 and the second heat sink 12) to be insulated from the first substrate 21 and/or the second substrate 22, a solid-state thermal conductive layer formed by curable silicone grease is selected for the thermal conductive layer 30. The curable silicone grease is an adhesive liquid material, and an adhesive and stable solid-state thermal conductive layer can be formed after preprocessing and curing processing, to firmly fasten the heat sink 10 to the power semiconductor package 20. In addition, because the silicone grease is an insulation material, the thermal conductive layer 30 insulates the first heat sink 11 and the second heat sink 12 from the first substrate 21 and the second substrate 22.

It should be noted that, in the conventional technology, a thermal conductive layer may use silicone grease. When the silicone grease is adhered to the heat sink 10 and the power semiconductor package 20 to form the power semiconductor module, the silicone grease in the power semiconductor module is in a non-solid state (for example, a liquid or a gel state). However, in this embodiment, the curable silicone grease may be composed of the silicone grease and a polymer film layer on a surface of the silicone grease or a liquid material containing a polymer material, and the polymer film layer or the polymer liquid material has a polymer material that can chemically react with the silicone grease to implement curing, that is, the polymer material is a material that reacts with silicone grease to implement curing effect. In this way, after the curable silicone grease is placed between the heat sink 10 and the power semiconductor package 20, under the action of heating or pressing, the polymer material in the polymer film layer diffuses into the silicone grease, and reacts with the silicone grease, so that the silicone grease is cured.

When the thermal conductive layer 30 is the solid-state thermal conductive layer formed by the curable silicone grease, and after the curable silicone grease is disposed between the power semiconductor package 20 and the heat sink 10, the silicone grease in the liquid state in the curable silicone grease is filled in the power semiconductor package 20 and fine uneven dent structures on a surface of the heat sink 10, so that after the curable silicone grease is cured, mutually embedded embedding force is formed between the thermal conductive layer 30 and the power semiconductor package 20 and between the thermal conductive layer 30 and the heat sink 10 (for example, the first heat sink 11 or the second heat sink 12), thereby ensuring fastened and close combination between the thermal conductive layer 30 and the power semiconductor package 20 and between the thermal conductive layer 30 and the heat sink 10. This is beneficial to rapid heat transmission and implementing timely heat dissipation of the power semiconductor module.

It should be noted that, in some examples, a roughening processing may alternatively be performed on surfaces that are of the power semiconductor package 20 and the heat sink 10 and that are respectively in contact with the thermal conductive layer 30, to further enhance the embedding force between the thermal conductive layer 30 and the power semiconductor package 20 and between the thermal conductive layer 30 and the heat sink 10.

In this embodiment, because the second substrate 22 is the conductive plate, no soldering pad 2209 is disposed on a surface of the second substrate 22, and the IGBT chip 23 is connected to the signal terminal 213 by using the bonding wire 211. For example, one end of the bonding wire 211 is electrically connected to the signal terminal 213 in a bonding manner, and the other end of the bonding wire 211 is electrically connected to the IGBT chip 23 in a bonding manner (as shown in FIG. 11), so that the IGBT chip 23 is connected to the signal terminal 213.

Embodiment 6

An embodiment further provides a motor driver, including a capacitor and at least one power semiconductor module connected to the capacitor in any one of the foregoing embodiments. The capacitor may be electrically connected to the first electrode terminal 28 and the second electrode terminal 29 in the power semiconductor module. For a structure and a working principle of the power semiconductor module in this embodiment, refer to the descriptions in the foregoing embodiments, and details are not described again in this embodiment.

The motor driver provided in this embodiment includes the power semiconductor module, so that a risk of damage caused by stress generated by the power semiconductor module in a process of assembling an entire motor driver is reduced. Integrated processing of a power semiconductor package and a heat sink and helium inspection of the power semiconductor module can be implemented before the entire motor driver is assembled, so that a defective product, that is, a heat sink with air leakage, can be screened out in advance. However, in the conventional technology, the power semiconductor package and the heat sink may be mounted in the entire motor driver first, and then, helium detection is performed on the entire motor driver. In this case, if air leakage occurs in the heat sink, the entire motor driver is scrapped, which greatly increases costs. In this embodiment, the helium detection may be performed on the power semiconductor module in advance. In this case, if air leakage occurs in the heat sink, only the power semiconductor module needs to be replaced, and the entire motor driver is not scrapped. Therefore, in this embodiment, a secondary processing yield of the entire motor driver is improved.

Embodiment 7

An embodiment further provides a powertrain, including a motor and the motor driver connected to the motor in Embodiment 6. For a structure and a working principle of a power semiconductor module in the motor driver, refer to the descriptions in the foregoing embodiments, and details are not described again in this embodiment.

The powertrain provided in this embodiment includes the power semiconductor module, so that a risk of damage caused by stress generated by the power semiconductor module in a process of assembling an entire motor driver is reduced. Integrated processing of a power semiconductor package and a heat sink and helium inspection of the power semiconductor module can be implemented before the entire motor driver is assembled, thereby avoiding a risk of scrapping the entire motor driver due to water leakage of the heat sink during a test of the entire motor driver.

Embodiment 8

An embodiment further provides a vehicle, including wheels, a motor, and the motor driver connected to the motor in Embodiment 6, and the motor is connected to the wheels by using a transmission component.

In this embodiment, the vehicle may be an electric vehicle/electric vehicle (EV), a pure electric vehicle/battery electric vehicle (PEV/BEV), a hybrid electric vehicle (HEV), a range extended electric vehicle (REEV), a plug-in hybrid electric vehicle (PHEV), a new energy vehicle (New Energy Vehicle), or the like.

For a structure and a working principle of a power semiconductor module in the motor driver, refer to the descriptions in the foregoing embodiments, and details are not described again in this embodiment.

The vehicle provided in this embodiment includes the power semiconductor module, so that a risk of damage caused by stress generated by the power semiconductor module in a process of assembling an entire motor driver is reduced. Integrated processing of a power semiconductor package and a heat sink and helium inspection of the power semiconductor module can be implemented before the entire motor driver is assembled, thereby avoiding a risk of scrapping the entire motor driver due to water leakage of the heat sink during a test of the entire motor driver.

Embodiment 9

Figure 12:
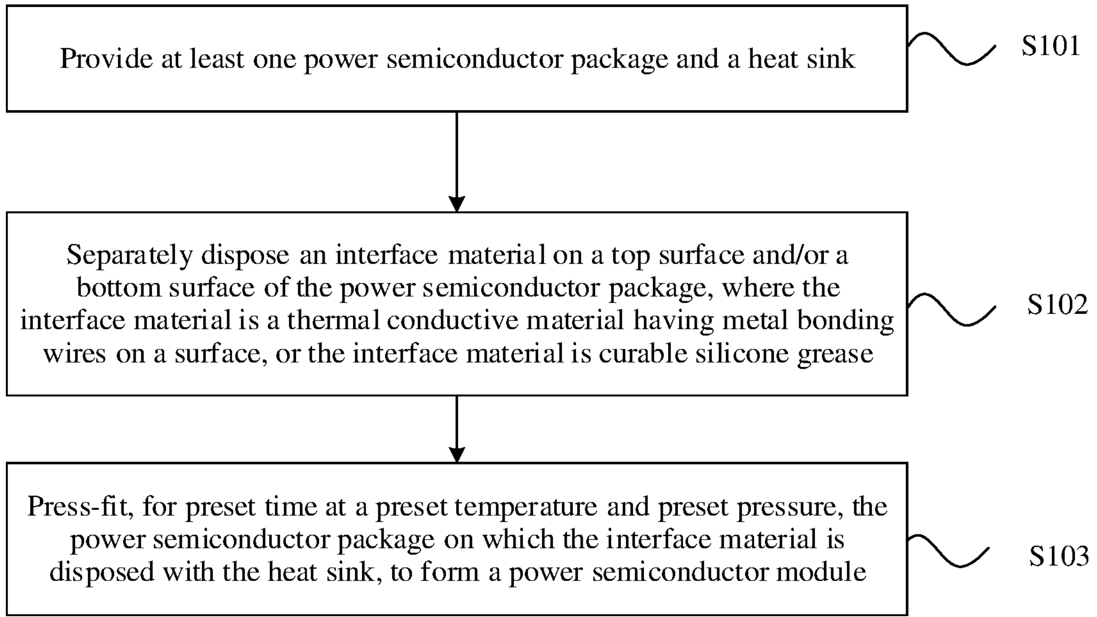
FIG. 12 is a schematic flowchart of a method for manufacturing a power semiconductor package according to an embodiment.

As shown in FIG. 12, an embodiment further provides a method for manufacturing a power semiconductor module, and the method includes the following steps:

S101: Provide at least one power semiconductor package and a heat sink.

S102: Separately dispose an interface material on a top surface and/or a bottom surface of the power semiconductor package.

For example, as shown in FIG. 4, the interface material may be disposed on a top surface of the power semiconductor package 20. The interface material may be a thermal conductive material having metal bonding wires on a surface, or the interface material may be curable silicone grease, so that the top surface of the power semiconductor package 20 and the heat sink 10 form an overall structure by using the interface material. Alternatively, the interface material may be disposed on a bottom surface of the power semiconductor package 20, so that the bottom surface of the power semiconductor package 20 and the heat sink 10 form an overall structure by using the interface material. Alternatively, the interface material may be disposed on the top surface and the bottom surface of the power semiconductor package 20 separately, so that the top surface and the bottom surface of the power semiconductor package 20 and the heat sink 10 (for example, the first heat sink 11 and the second heat sink 12 in FIG. 1) respectively form an overall structure by using the interface material.

S103: Press-fit, for preset time at a preset temperature and preset pressure, the power semiconductor package 20 on which the interface material is disposed with the heat sink 10, to form the power semiconductor module, where the interface material forms a solid-state thermal conductive layer between power semiconductor package 20 and the heat sink 10.

When the interface material is the curable silicone grease, press-fitting, for the preset time at the preset temperature and preset pressure, the power semiconductor package 20 on which the interface material is disposed with the heat sink 10, to form the power semiconductor module includes the following steps:

performing, for first preset time and at first preset pressure and first preset temperature conditions, press-fitting preprocessing on the power semiconductor package 20 on which the interface material is disposed and the heat sink 10, where the first preset pressure may be 1 MPa to 3 MPa, the first preset temperature may be 110° C. to 130° C., and the first preset time may be 15 minutes to 25 minutes; and performing, for second preset time and under second preset pressure and second preset temperature conditions, curing processing between the preprocessed power semiconductor package 20 and the heat sink 10, so that the curable silicone grease forms a solid-state thermal conductive layer that is separately combined with the heat sink 10 and the power semiconductor package 20, where the second preset pressure may be 4 MPa to 8 MPa, the second preset temperature may be 170° C. to 190° C., and the second preset time may be 110 minutes to 130 minutes.

The curable silicone grease can form an adhesive and stable solid-state thermal conductive layer after the preprocessing and the curing processing, to firmly fasten the heat sink 10 to the power semiconductor package 20 and form the power semiconductor module.

When the interface material is the thermal conductive material having metal bonding wires on a surface, before separately disposing the interface material on the top surface and the bottom surface of the power semiconductor package 20, the method further includes the following steps:

performing deoxidation treatment on the top surface and/or the bottom surface of the power semiconductor package 20; and forming a metal plating layer on a surface that is of the heat sink 10 and that faces the power semiconductor package 20, or performing the deoxidation treatment on a surface that is of the heat sink 10 and that faces the power semiconductor package 20.

The deoxidation treatment makes the top surface and the bottom surface of the power semiconductor package 20 expose a metal element, and the metal plating layer formed on the surface that is of the heat sink 10 and that faces the power semiconductor package 20 can prevent generation of an oxidized layer, to enable a metal material to form, between the heat sink 10 and the power semiconductor package 20, a solid-state thermal conductive layer having molecular bonding force.

If the metal plating layer is not applied to the surface that is of the heat sink 10 and that faces the power semiconductor package 20, the deoxidation treatment may also be performed on the surface to expose the metal element. This can also ensure that the metal material can form, between the heat sink 10 and the power semiconductor package 20, the solid-state thermal conductive layer having the molecular bonding force.

In the descriptions of embodiments, it should be noted that, unless otherwise clearly specified and limited, terms "mounted", "connected", and "connection" should be understood in a broad sense. For example, the terms may be used for a fastened connection, may be an indirect connection through an intermediate medium, may be an internal connection between two elements, or an interaction relationship between two elements. For a person of ordinary skill in the art, meanings of the foregoing terms in the embodiments may be understood based on a situation.

In the embodiments and accompanying drawings, terms "first", "second", "third", "fourth", and so on (if existent) are intended to distinguish between similar objects but do not necessarily indicate an order or sequence.

The invention claimed is:

1. A power semiconductor module, comprising:

at least one heat sink;

at least one power semiconductor package; and a thermal conductive layer, wherein the thermal conductive layer is located between the heat sink and the power semiconductor package, and the thermal conductive layer is a thermal conductive material having metal bonding wires on a surface or a solid-state thermal conductive layer formed by curable silicone grease; and both the power semiconductor package and the heat sink are combined with the thermal conductive layer to form the power semiconductor module;

wherein each power semiconductor package at least comprises a first substrate, a second substrate, and at least one chip, and the chip is fastened between the first substrate and the second substrate;

the at least one chip is electrically connected to the first substrate and the second substrate; and the thermal conductive layer is disposed between the heat sink and the first substrate and/or between the heat sink and the second substrate;

wherein the chip comprises an insulated gate bipolar transistor chip and a diode chip; or the chip comprises a silicon metal-oxide-semiconductor field-effect transistor or a silicon carbide metal-oxide-semiconductor field-effect transistor; and the power semiconductor package further comprises:

at least one conductive pad, and the conductive pad is located between the chip and the first substrate; and two ends of the conductive pad are respectively connected to the chip and the first substrate by using conductive connecting layers.

2. The power semiconductor module according to claim 1, wherein the thermal conductive layer comprises:

a metal thermal conductive sheet and the metal bonding wires disposed on a surface of the metal thermal conductive sheet.

3. The power semiconductor module according to claim 1, wherein the metal thermal conductive sheet is a copper foil, an aluminum foil, a silver foil, or a gold leaf, and the metal bonding wire is a nano copper wire, a nano aluminum wire, a nano silver wire, or a nano gold wire.

4. The power semiconductor module according to claim 1, wherein the thermal conductive layer further comprises:

thermal conductive adhesive, and the thermal conductive adhesive is distributed in a gap between adjacent metal bonding wires.

5. The power semiconductor module according to claim 1, wherein there are two heat sinks, the two heat sinks are respectively a first heat sink and a second heat sink that are opposite to each other, the power semiconductor package is disposed between the first heat sink and the second heat sink, and the thermal conductive layer is disposed between the power semiconductor package and the first heat sink and between the power semiconductor package and the second heat sink.

6. The power semiconductor module according to claim 5, wherein one end of the first heat sink and one end of the second heat sink are connected by using a connecting plate, and the other end of the first heat sink and the other end of the second heat sink are connected by using a fastener; or two ends of the first heat sink and the second heat sink are connected by using a connecting pipe, and two ends of the first heat sink and the second heat sink are connected by using a connecting pipe.

7. The power semiconductor module according to claim 6, wherein a heat dissipation water channel is disposed inside the first heat sink and a heat dissipation water channel is disposed inside the second heat sink, the heat dissipation water channel in the first heat sink and the heat dissipation water channel in the second heat sink are connected in series by using the connecting plate, and a water inlet and a water outlet that communicate with the heat dissipation water channels are respectively disposed at the other end of the first heat sink and the other end of the second heat sink; or a heat dissipation water channel is disposed inside the first heat sink and a heat dissipation water channel is disposed inside the second heat sink, the heat dissipation water channel in the first heat sink and the heat dissipation water channel in the second heat sink are connected in parallel by using the connecting pipes, and a water inlet is disposed at one end of the first heat sink, and a water outlet is disposed at one end that is of the second heat sink and that is away from the water inlet.

8. The power semiconductor module according to claim 1, wherein the first substrate has a first conductive area and a second conductive area that are insulated from each other and arranged side by side;

the second substrate has a third conductive area and a fourth conductive area that are insulated from each other and arranged side by side, the first conductive area is opposite to the third conductive area, and the second conductive area is opposite to the fourth conductive area;

a part of the chip is located between the first conductive area and the third conductive area, and a part of the chip is located between the second conductive area and the fourth conductive area; and the first conductive area is connected to the fourth conductive area, or the second conductive area is connected to the third conductive area.

9. The power semiconductor module according to claim 8, wherein both the first substrate and the second substrate are conductive plates;

the first substrate comprises a first conductive plate and a second conductive plate that are insulated from each other and arranged side by side, the first conductive plate has the first conductive area, and the second conductive plate has the second conductive area;

the second substrate comprises a third conductive plate and a fourth conductive plate that are insulated from each other and arranged side by side, the third conductive plate has the third conductive area, and the fourth conductive plate has the fourth conductive area; and the heat sink is disposed to be insulated from the conductive plate.

10. The power semiconductor module according to claim 8, wherein the first substrate comprises:

a first conductive layer and a first insulation plate, and the first conductive layer is located on a surface that is of the first insulation plate and that faces the chip;

the second substrate comprises:

a second conductive layer and a second insulation plate, and the second conductive layer is located on a surface that is of the second insulation plate and that faces the chip; and the first conductive layer at least comprises the first conductive area and the second conductive area, and the second conductive layer at least comprises the third conductive area and the fourth conductive area.

11. The power semiconductor module according to claim 10, wherein the first substrate further comprises:

a first copper layer, and the first copper layer is located on a surface that is of the first insulation plate and that faces the thermal conductive layer; and the second substrate further comprises:

a second copper layer, the second copper layer is located on a surface that is of the second insulation plate and that faces the thermal conductive layer, and the thermal conductive layer is disposed between the heat sink and the first copper layer and/or between the heat sink and the second copper layer.

12. The power semiconductor module according to claim 8, wherein the power semiconductor package further comprises:

a wiring terminal, one end of the wiring terminal has a first terminal and a second terminal, one of the first terminal and the second terminal is electrically connected to the first conductive area, and the other of the first terminal and the second terminal is electrically connected to the fourth conductive area, so that the first conductive area is connected to the fourth conductive area; or one of the first terminal and the second terminal is electrically connected to the second conductive area, and the other of the first terminal and the second terminal is electrically connected to the third conductive area, so that the second conductive area is connected to the third conductive area; or both the first terminal and the second terminal are electrically connected to the third conductive area or both the first terminal and the second terminal are electrically connected to the fourth conductive area.

13. The power semiconductor module according to claim 12, wherein the power semiconductor package further comprises:

a first electrode terminal; and a second electrode terminal, one of the first electrode terminal and the second electrode terminal is a positive terminal, and the other of the first electrode terminal and the second electrode terminal is a negative terminal; and one of the first electrode terminal and the second electrode terminal is electrically connected to the first conductive area, and the other of the first electrode terminal and the second electrode terminal is electrically connected to the fourth conductive area; or one of the first electrode terminal and the second electrode terminal is electrically connected to the second conductive area, and the other of the first electrode terminal and the second electrode terminal is electrically connected to the third conductive area.

14. A motor driver, comprising a capacitor and a power semiconductor module, wherein an electrode terminal of the power semiconductor module is electrically connected to the capacitor, wherein the power semiconductor module comprises at least one heat sink and at least one power semiconductor package, and a thermal conductive layer, wherein:

the thermal conductive layer is located between the heat sink and the power semiconductor package, and the thermal conductive layer is a thermal conductive material having metal bonding wires on a surface or a solid-state thermal conductive layer formed by curable silicone grease; and both the power semiconductor package and the heat sink are combined with the thermal conductive layer to form the power semiconductor module;

wherein each power semiconductor package at least comprises a first substrate, a second substrate, and at least one chip, and the chip is fastened between the first substrate and the second substrate;

the at least one chip is electrically connected to the first substrate and the second substrate; and the thermal conductive layer is disposed between the heat sink and the first substrate and/or between the heat sink and the second substrate;

wherein the chip comprises an insulated gate bipolar transistor chip and a diode chip; or the chip comprises a silicon metal-oxide-semiconductor field-effect transistor or a silicon carbide metal-oxide-semiconductor field-effect transistor; and the power semiconductor package further comprises:

at least one conductive pad, and the conductive pad is located between the chip and the first substrate; and two ends of the conductive pad are respectively connected to the chip and the first substrate by using conductive connecting layers.

15. A method for manufacturing a power semiconductor module, the method comprising:

providing at least one power semiconductor package and a heat sink;

separately disposing an interface material on a top surface and/or a bottom surface of the power semiconductor package, wherein the interface material is a thermal conductive material having metal bonding wires on a surface, or the interface material is curable silicone grease; and press-fitting, for preset time at a preset temperature and preset pressure, the power semiconductor package on which the interface material is disposed with the heat sink, to form the power semiconductor module.

16. The method for manufacturing a power semiconductor module according to claim 15, wherein when the interface material is the curable silicone grease, the press-fitting, for preset time at a preset temperature and preset pressure, the power semiconductor package on which the interface material is disposed with the heat sink, to form the power semiconductor module comprises:

performing, for first preset time and under first preset pressure and first preset temperature conditions, press-fitting preprocessing on the power semiconductor package on which the interface material is disposed and the heat sink; and performing, for second preset time and under second preset pressure and second preset temperature conditions, curing processing between the preprocessed power semiconductor package and the heat sink, so that the curable silicone grease forms a solid-state thermal conductive layer.

17. The method for manufacturing a power semiconductor module according to claim 15, wherein when the interface material is the thermal conductive material having metal bonding wires on a surface, before the separately disposing an interface material on a top surface and/or a bottom surface of the power semiconductor package, the method further comprises:

performing deoxidation treatment on the top surface and/or the bottom surface of the power semiconductor package; and forming a metal plating layer on a surface that is of the heat sink and that faces the power semiconductor package, or performing the deoxidation treatment on a surface that is of the heat sink and that faces the power semiconductor package.

* * * * *